United States Patent [19]
Noble

[11] Patent Number: 5,973,352
[45] Date of Patent: Oct. 26, 1999

[54] ULTRA HIGH DENSITY FLASH MEMORY HAVING VERTICALLY STACKED DEVICES

[75] Inventor: Wendell P. Noble, Milton, Vt.

[73] Assignee: Micron Technology, Inc., Boise, Id.

[21] Appl. No.: 08/915,197

[22] Filed: Aug. 20, 1997

[51] Int. Cl.[6] .......................... H01L 29/788; H01L 29/76; G11C 11/34

[52] U.S. Cl. .................... 257/315; 438/212; 365/185.03; 365/185.06

[58] Field of Search .................................. 257/315, 319; 438/212; 365/185.03, 185.06

[56] References Cited

U.S. PATENT DOCUMENTS

| | | | |
|---|---|---|---|
| 5,037,773 | 8/1991 | Lee et al. | 437/60 |
| 5,053,351 | 10/1991 | Fazan et al. | 437/52 |
| 5,229,647 | 7/1993 | Gnadinger | 257/785 |
| 5,241,211 | 8/1993 | Tashiro | 257/506 |
| 5,254,499 | 10/1993 | Sandhu et al. | 437/192 |
| 5,272,367 | 12/1993 | Dennison et al. | 257/306 |
| 5,444,013 | 8/1995 | Akram et al. | 437/60 |
| 5,449,433 | 9/1995 | Donohoe | 156/643.1 |
| 5,460,988 | 10/1995 | Hong | 257/315 |
| 5,523,261 | 6/1996 | Sandhu | 437/228 |
| 5,599,396 | 2/1997 | Sandhu | 118/723 I |
| 5,636,170 | 6/1997 | Sayyedy | 365/205 |
| 5,696,008 | 12/1997 | Tamaki et al. | 438/212 |
| 5,757,044 | 5/1998 | Kubota | 257/316 |

OTHER PUBLICATIONS

Jung, T., et al., "A 117–mm2 3.3–V Only 128–Mb Multi-level Nand Flash Memory for Mass Storage Applications", *IEEE Journal of Solid–State Circuits,* 31, 1575–1582, (Nov. 1996).

Primary Examiner—Donald L. Monin, Jr.
Assistant Examiner—Howard Weiss
Attorney, Agent, or Firm—Schwegman, Lundberg, Woessner & Kluth P.A.

[57] ABSTRACT

An ultra high density flash EEPROM provides increased nonvolatile storage capacity. A memory array includes densely packed memory cells, each cell having a pillar of semiconductor material that extends outwardly from a working surface of a substrate. The pillar includes source/drain and body regions and has a number of sides. A pair of vertically stacked floating gates is included on at least one of two sides of the pillar. A control gate line also passes through each memory cell. Each memory cell is associated with a control gate line so as to allow selective storage and retrieval of data on the floating gates of the cell. Both bulk semiconductor and silicon-on-insulator embodiments are provided. If a floating gate transistor is used to store a single bit of data, an area of only $F^2$ is needed per bit of data, where F is the minimum lithographic feature size. If multiple charge states (more than two) are used, an area of less than $F^2$ is needed per bit of data.

13 Claims, 20 Drawing Sheets

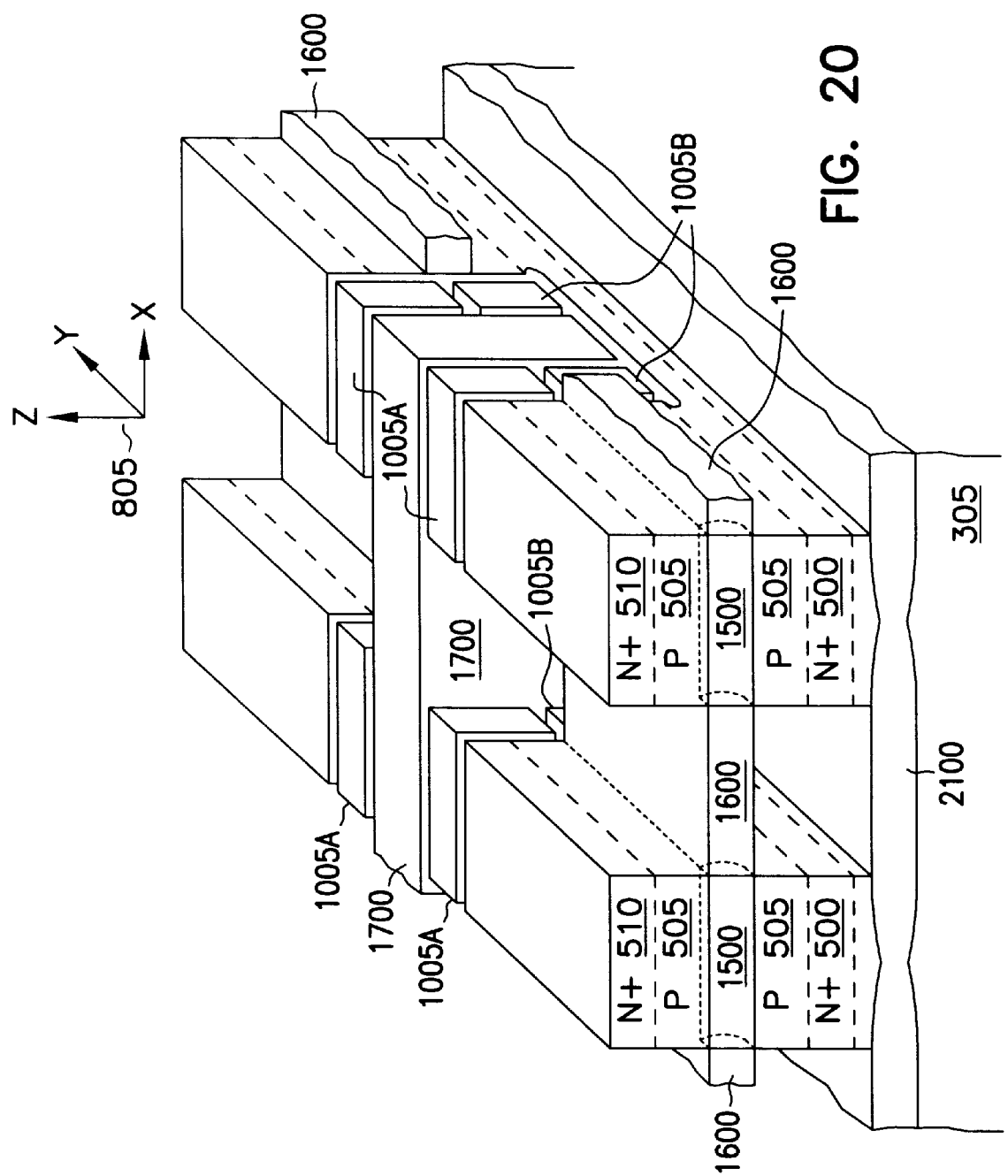

ULTRA HIGH DENSITY FLASH MEMORY HAVING VERTICALLY STACKED DEVICES

TECHNICAL FIELD OF THE INVENTION

This invention relates generally to integrated circuits, and particularly to ultra high density flash memory having vertically stacked devices.

BACKGROUND OF THE INVENTION

Electrically erasable and programmable read only memories (EEPROMs) are reprogrammable nonvolatile memories that are widely used in computer systems for storing data both when power is supplied or removed. The typical data storage element of an EEPROM is a floating gate transistor, which is a field-effect transistor (FET) having an electrically isolated (floating) gate that controls electrical conduction between source and drain regions. Data is represented by charge stored on the floating gate and the resulting conductivity obtained between source/drain regions.

Increasing the storage capacity of EEPROM memories requires a reduction in the size of the floating gate transistors and other EEPROM components in order to increase the EEPROM's density. However, memory density is typically limited by a minimum lithographic feature size (F) that is imposed by lithographic processes used during fabrication. For example, the present generation of high density dynamic random access memories (DRAMs), which are capable of storing 256 Megabits of data, require an area of $8F^2$ per bit of data. There is a need in the art to provide even higher density memories in order to further increase storage capacity.

SUMMARY OF THE INVENTION

Embodiments of the present invention include an ultra high density electrically erasable and programmable read only memory (EEPROM) providing increased nonvolatile storage capacity through the use of vertically stacked devices. In one embodiment, the memory allows simultaneous erasure of multiple data bits, and is referred to as a flash EEPROM. Both bulk semiconductor and semiconductor-on-insulator (SOI) embodiments are included. Embodiments of the present invention includes bulk semiconductor and semiconductor-on-insulator ultra high density flash EEPROM having increased nonvolatile storage capacity. If a floating gate transistor is used to store a single bit of data, an area of only $F^2$ is needed per bit of data, where F is the minimum lithographic feature size. If multiple charge states (more than two) are used, an area of less than $F^2$ is needed per bit of data. The increased storage capacity of the flash EEPROM is particularly advantageous in replacing hard disk drive data storage in computer systems. In such an application, the delicate mechanical components included in the hard disk drive are replaced by rugged, small, and durable solid-state flash EEPROM packages. The flash EEPROMs provide improved performance, extended rewrite cycles, increased reliability, lower power consumption, and improved portability.

In one embodiment of the invention, a memory cell includes a pillar of semiconductor material that extends outwardly from a working surface of a substrate. The pillar includes source/drain and body regions and has a number of sides. A pair of vertically stacked floating gates is included on at least one of two sides of the pillar. A control gate line also passes through each memory cell. Each memory cell is associated with a control gate line so as to allow selective storage and retrieval of data on the floating gates of the cell. In one embodiment, the control gate line is capable of storing more than two charge states on its associated floating gate.

Other embodiments of the present invention include memory cells, devices, arrays, and methods of making such arrays, all of which utilize vertically stacked devices. Still further and other embodiments, advantages and aspects of the invention will become apparent by reading the following detailed description, and by reference to the drawings.

BRIEF DESCRIPTION OF THE DRAWINGS

In the drawings, like numerals describe substantially similar components throughout the several views.

FIG. 20 is a perspective view of a structure resulting from another embodiment of a method of forming the array of memory cells according to the invention, using semiconductor-on-insulator (SOI) techniques.

DETAILED DESCRIPTION OF THE INVENTION

Figure 1:
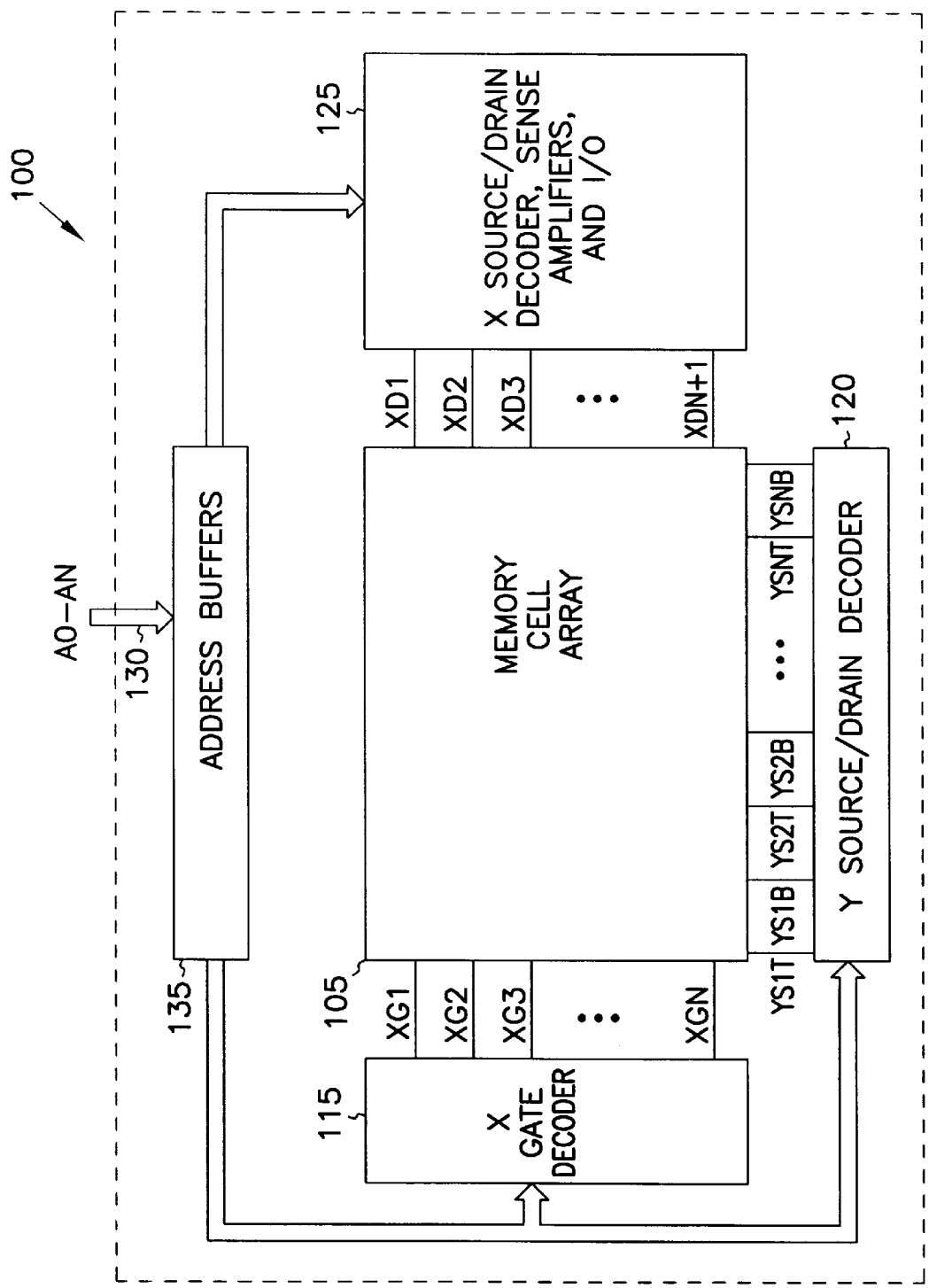
FIG. 1 is a block diagram illustrating generally an architecture of one embodiment of a nonvolatile memory, according to the teachings of the invention, including an array having a plurality of memory cells.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art, including bulk semiconductor and semiconductor-on-insulator (SOI) substrates. In the drawings, like numerals describe substantially similar components throughout the several views. The following detailed description is not to be taken in a limiting sense.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above.

Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

FIG. 1 is a schematic/block diagram illustrating generally an architecture of one embodiment of a memory 100 according to the present invention. In the embodiment of FIG. 1, memory 100 is a nonvolatile ultra high density electrically erasable and programmable read only memory (EEPROM) allowing simultaneous erasure of multiple data bits, referred to as a flash EEPROM. However, the invention can be applied to other semiconductor memory devices, such as static or dynamic random access memories (SRAMs and DRAMs, respectively), synchronous random access memories or other types of memories that include a matrix of selectively addressable memory cells.

Memory 100 includes a memory cell array 105, having memory cells therein that include floating gate transistors, as described below. X gate decoder 115 provides a plurality of gate control lines, XG1, XG2, . . . , XGN for addressing floating gate transistors in array 105, as described below. Y source/drain decoder 120 provides a plurality of source/drain interconnection lines YS1T, YS1B, YS2T, YS2B, . . . , YSNT, YSNB for accessing source/drain regions of the floating gate transistors in array 105, as described below. X source/drain decoder 125 provides a plurality of source/drain interconnection lines XD1, XD2, . . . , XDN+1 for accessing source/drain regions of the floating gate transistors in array 105, as described below. X source/drain decoder 125 also typically includes sense amplifiers and input/output (I/O) circuitry for reading, writing, and erasing data to and from array 105. In response to address signals AO-AN that are provided on address lines 130 during read, write, and erase operations, address buffers 135 control the operation of X gate decoder 115, Y source/drain decoder 120, and X source/drain decoder 125. The address signals AO-AN are provided by a controller such as a microprocessor that is fabricated separately or together with memory 100, or otherwise provided by any other suitable circuits. As described in detail below, the address signals AO-AN are decoded by X gate decoder 115, Y source/drain decoder 120, and X source/drain decoder 125 to perform reading, writing, and erasing operations on memory cells that include a number of vertically stacked floating gate field-effect transistors (FETs) formed on the sides of a semiconductor pillar on a substrate.

Figure 2:
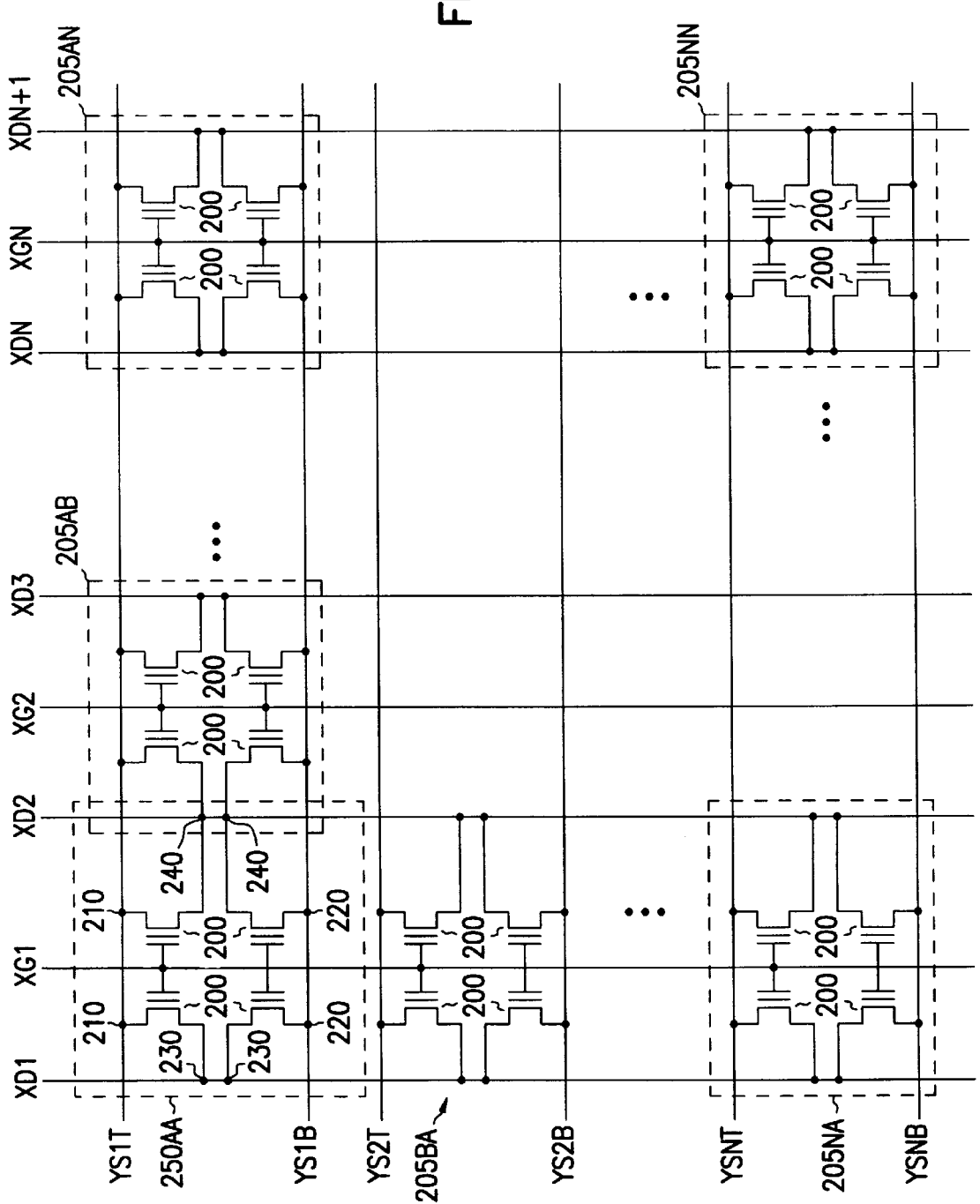
FIG. 2 is a schematic diagram illustrating generally one embodiment of an array of memory cells according to the teachings of the invention.

FIG. 2 is a schematic diagram illustrating generally one embodiment of array 105 in more detail. In FIG. 2, each memory cell 205 comprises four floating gate transistors 200, e.g. four field-effect transistors (FETs), each having an electrically isolated (floating) gate that controls electrical conduction between source/drain and source/drain regions. The floating gate transistors 200 are arranged in cells 205, such as cells 205AA, 205BA, . . . , 205NA, in a first direction, e.g. in the X-direction of the source/drain interconnection lines XD1, XD2, . . . , XDN, and in cells such as 205AA, 205AB, . . . , 205AN in a second direction, e.g. in the Y-direction of the source/drain interconnection lines, YS1T, YS1B, YS2T, YS2B, . . . , YSNT, YSNB. In the embodiment of FIG. 2, each cell 205 includes four floating gate transistors 200 that share a common gate region, such as a control gate region coupled to one of the gate interconnection lines XG1, XG2, XG3, . . . XGN. The floating gate transistors 200 of each cell 205 also are divided into pairs such that a source/drain region of a first gate of each pair is coupled to one of the top source/drain interconnection lines in the Y-direction, YS1T, YS2T, . . . , YSNT, and such that a source/drain region of a second gate of each pair is coupled to one of the bottom source/drain interconnection lines in the Y-direction, YS1B, YS2B, . . . , YSNB. The four floating gate transistors 200 of each cell 205 are also configured such that a source/drain region of each transistor of a pair is coupled to the same source/drain interconnection line XD1, XD2, . . . , or XDN, as a source/drain region of the other transistor of the pair.

Thus, each cell 205 has two pairs of vertically stacked transistors 200, the two transistors of one pair sharing a different source/drain interconnection line that the two transistors of the other pair, the top transistors of each pair sharing the same source/drain interconnection line, the bottom transistors of each pair sharing the same source/drain interconnection line, and all the transistors sharing the same control gate line. The source/drain regions of the top gates of the pairs of stacked gates are coupled to the same source/drain interconnection line, YSxT, where $0 < x < N+1$. The source/drain regions of the bottom gates of the pairs of stacked gates are coupled to the same source/drain interconnection line, YSxB. The source/drain regions of the gates of one pair are coupled to a source/drain interconnection line XDy, where $0 < y < N+1$. The source/drain regions of the gates of the other pair are coupled to a source/drain interconnection line XD(y+1). The control gate region of each gate is coupled to one of the gate interconnection line XGy.

It is noted that the term memory cell as used to refer to each element 205 differs from the nomenclature usually associated with the term memory cell. Specifically, each memory cell 205 includes four transistors as shown in FIG. 2. In the usual nomenclature, each of these transistors would themselves be a memory cell, since each is capable of holding at least one charge.

Figure 3:
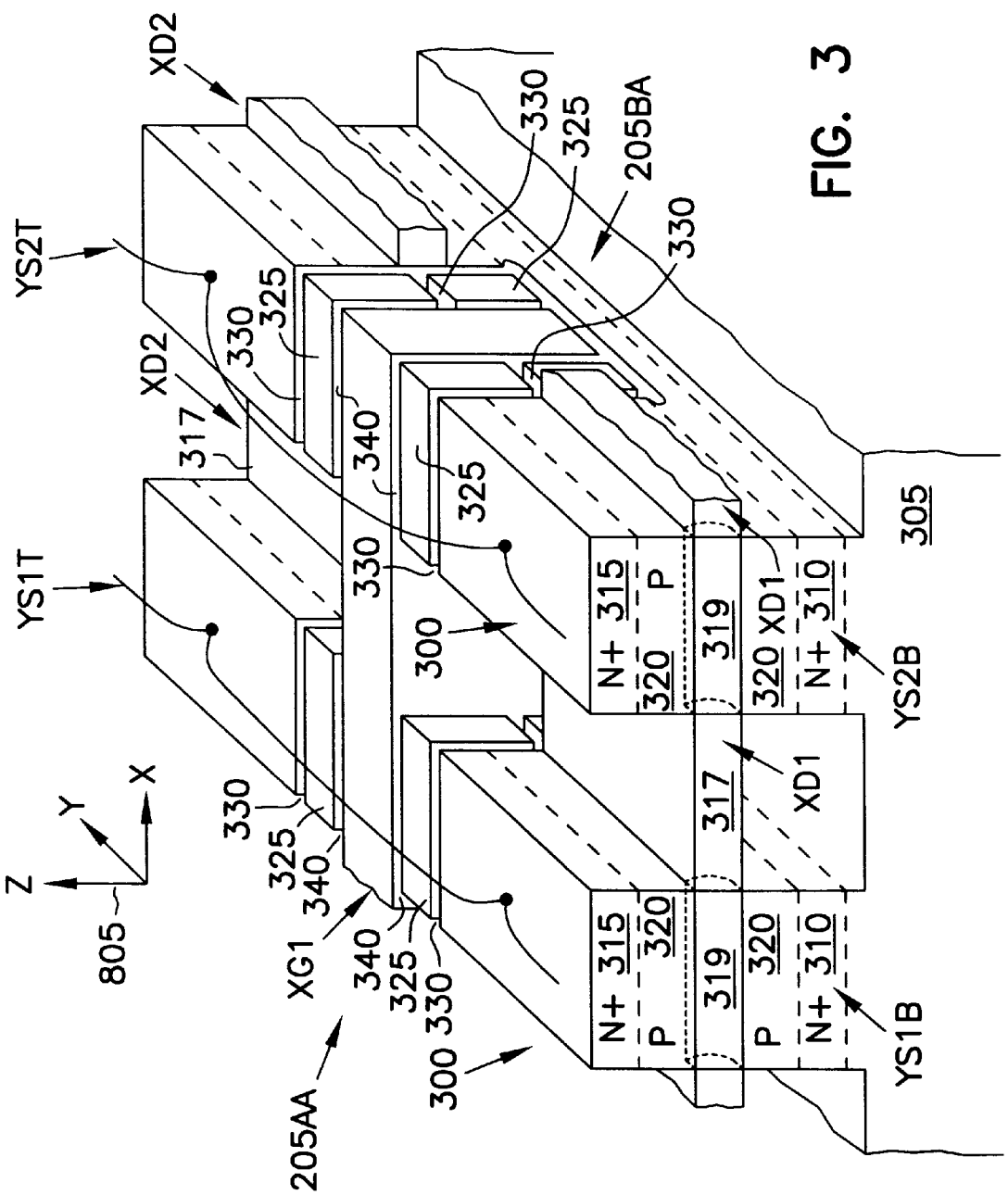
FIG. 3 is a perspective view illustrating generally one embodiment of a portion of an array of memory cells according to the teachings of the invention.

FIG. 3 is a perspective view illustrating generally one embodiment of a portion of array 105, including portions of two cells 205 of floating gate transistors 200, such as illustrated in FIG. 2. In FIG. 3, the substantially identical cells 205 are illustrated by way of example through cells 205AA and 205BA. Cells 205AA and 205BA each include two semiconductor pillars 300, initially of a first conductivity type such as P- silicon, fabricated upon a monolithic substrate 305. In one embodiment, substrate 305 is a bulk semiconductor, such as P- silicon. In another embodiment, a semiconductor-on-insulator (SOI) substrate 305 includes an insulating layer, such as silicon dioxide ($SiO_2$), as described below.

Each pillar 300 includes a first source/drain region of a second conductivity type, such as N+ silicon source/drain region 310, formed proximally to a sub-micron dimensioned interface between pillar 300 and substrate 305. Each pillar 300 also includes a second source/drain region of the second conductivity type, such as N+ silicon source/drain region 315, that is distal to substrate 305, and separated from source/drain region 310 by a first conductivity type region, such as P- body region 320. Interposed between adjacent pillars 300 in the X-direction (i.e., the direction of gate interconnection line XG1) is a region 317 of the second conductivity type, such as N+ silicon, which serves as the source/drain interconnection lines XD1, XD2, . . . , XDN+1. Disposed partially within the first conductivity type region 320 is third source/drain region 319 of the second conductivity type, such as N+ silicon.

Each pillar 300 thus has a first source/drain region 310, a second source/drain region 315, a third source/drain region 319 and a body region 320 for two of the four floating gate transistors 200 of a particular memory cell 205. In one embodiment, the physical dimensions of each pillar 300 and the doping of P- body region 320 are both sufficiently small to allow operation of the floating gate transistors 200 that is characteristic of fully depleted body transistors. First source/drain region interconnection line YS1B electrically interconnects the source/drain region 310 of each pillar 300 of cells 205AA, 205AB, . . . , 205AN.

In one embodiment, the source/drain interconnection lines YS1B, YS2B, . . . . YSNB, comprise a conductively doped semiconductor of the second conductivity type, such as N+ silicon, disposed at least partially within substrate 305. For example, dopants can be ion-implanted or diffused into substrate 305 to form the source/drain interconnection lines YS1B, YS2B, . . . , YSNB. In another embodiment, the source/drain interconnection lines YS1B, YS2B, . . . , YSNB are formed above substrate 305. For example, a doped epitaxial semiconductor layer can be grown on substrate 305, from which source/drain interconnection lines YS1B, YS2B, . . . , YSNB are formed. Alternatively, an undoped epitaxial semiconductor layer can be grown on substrate 305, and dopants then introduced by ion-implantation or diffusion to obtain the source/drain interconnection lines YS1B, YS2B, . . . , YSNB of the desired conductivity.

Source/drain regions 315 of the pillars 300 are interconnected by source/drain interconnection lines YS1T, YS2T, . . . , YSNT, that are substantially parallel to each other in the Y-direction. FIG. 3 illustrates, by way of example, source/drain interconnection lines YS1T and YS2T, which are shown schematically for clarity. However, it is understood that lines YS1T, YS2T, . . . , YSNT comprise metal or other interconnection lines that are isolated from the underlying topology by an insulating layer through which contact holes are etched to access the source/drain regions 315 of the pillars 300. Furthermore, N+ doped polysilicon 317 interposed between the source/drain regions 319 of pillars 300 constitute source/drain interconnection lines XD1, XD2, . . . , XDN, that are substantially parallel to each other in the X-direction. The different sections of N+ doped polysilicon 317 are electrically connected to one another via regions 319.

Each pillar 300 is outwardly formed from substrate 305, and is illustrated in FIG. 3 as extending vertically upward from substrate 305. Each pillar 300 has a top region that is separated from substrate 305 by four surrounding side regions. Two vertically stacked floating gates 325 are formed substantially adjacent to one side surface of pillar 300, and separated from each other and from pillar 300 by a dielectric 330, such that there are four floating gates 325 per pillar 300, though FIG. 3 omits the floating gates 325 at the opposite side of pillar 300 for clarity of illustration. A control gate line XG1, XG2, . . . , or XGN acts as the control gate for each floating gate 325, and each floating gate 325 is separated from a control gate line by a dielectric 340. FIG. 3 illustrates, by way of example, control gate line XG1 as the control gate for each floating gate 325 of FIG. 3. Each of the control gate lines XG1, XG2, . . . , XGN is substantially parallel to each other in the X-direction.

Figure 4:
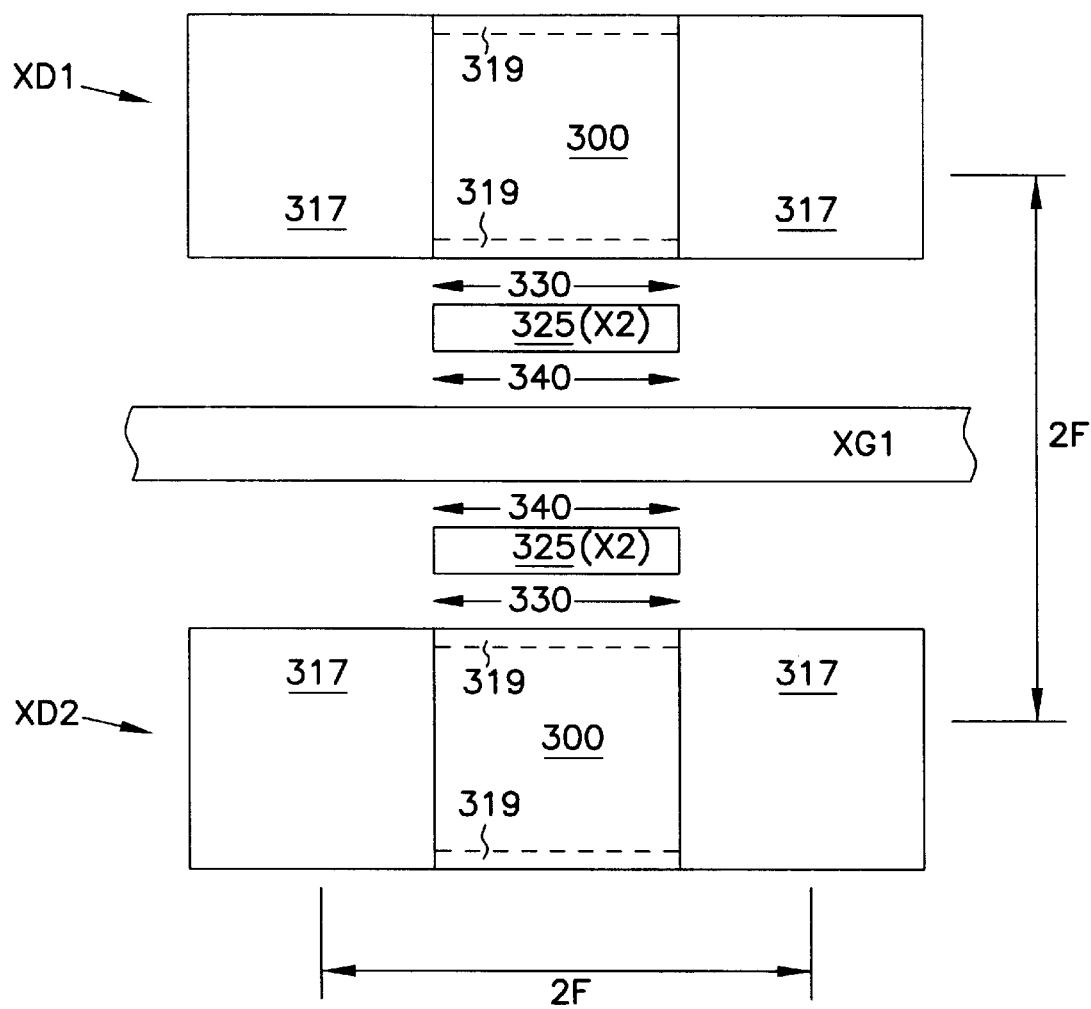
FIG. 4 is a plan view from above of a working surface of a substrate, which illustrates one embodiment of one of a memory cell according to the teachings of the invention.

FIG. 4 is a plan view, looking toward the working surface of substrate 305, illustrating generally by way of example one embodiment of one of cells 205 of four floating gate transistors 200, such as cell 205AA. In FIG. 4, each of two vertically stacked pairs of floating gates 325 (each pair denoted as an element 325 (x2) in FIG. 4) is adjacent to one side of a pillar 300, and separated therefrom by gate dielectric 330. Control gate line XG1 is separated from each of the two vertically stacked pairs of floating gates 325 by an intergate dielectric 340. Adjacent to two of the other sides of each pillar 300 is the source/drain region of the second conductivity type, such as N+ silicon source/drain region 317. On one side of control gate line XG1 is source/drain interconnection line XD1 (i.e., N+ polysilicon regions 317), as electrically coupled together by interposed source/drain regions 319. On the other side of control gate line XG1 is source/drain interconnection line XD2 (i.e., N+ polysilicon regions 317), as also electrically coupled together by interposed source/drain regions 319.

The center-to-center spacing ("pitch") between adjacent regions 317 is twice the minimum lithographic feature size F. Since four floating gate transistors 200 are contained within a cell 205 having an area of $4F^2$, an area of only $F^2$ is needed per bit of data. In another embodiment, multiple charge states (more than two) are used to obtain correspondingly higher data storage densities, such that an area of less than $F^2$ is needed per bit of data, since more than one bit of data can be stored on a single floating gate transistor 200. In one embodiment, four charge states are used to store two bits of data per floating gate transistor 200, corresponding to eight bits of data per memory cell 205. One example of using more than two charge states to store more than one bit of data per transistor is set forth an article by T.-S. Jung et al., entitled "A 117-mm$^2$ 3.3-V Only 128-Mb Multilevel NAND Flash Memory For Mass Storage Applications," *IEEE J. Solid-State Circuits,* Vol. 31, No. 11, November 1996. In a further embodiment, a continuum of charge states is used to store analog data in array 105.

In one embodiment, programming of one of the floating gate transistors 200 is by hot electron injection. For example, a voltage of approximately 10 volts is provided, such as by X gate decoder 115, through a particular one of the control gate lines XG1, XG2, . . . , XGN. A resulting inversion region (channel) is formed in the body region 320 at the surface that is approximately adjacent to the particular one of control gate lines XG1, XG2, . . . , XGN. A voltage of approximately 5 Volts is provided, such as by X source/drain decoder 125, through a particular one of source/drain interconnection lines XD1, XD2, . . . , XDN+1 to a particular source/drain region 319. A voltage of approximately 0 Volts is provided, such as by Y source/drain decoder 120, through a particular one of source/drain interconnection lines YS1T, YS1B, YS2T, YS2B, . . . , YSNT, YSNB, to the particular source/drain region 310 (in the case of a line YSxB, where 0<x<N+1) or source/drain region 315 (in the case of line YSxT, where 0<x<N+1) of the floating gate transistor 200. Selecting one of source/drain interconnection lines YSxT selects the top of a pair of vertically stacked devices, while selecting one of source/drain interconnect lines YSxB selects the bottom of a pair of vertically stacked devices. Electrons are injected onto the floating gate 325 interposed between the particular gate line selected and the pillar 300 in which the particular source/drain region 319 is disposed. The exact value of the voltages provided to the particular gate line and source/drain region 319 will depend on the physical dimension of the floating gate transistor 200, including the thickness of the gate dielectric 330, the thickness of the intergate dielectric 340, and the separation between source/drain region 310 or 315 and source/drain region 319. Alternatively, if higher voltages are provided to the particular gate line, and the gate dielectric 330 and intergate dielectric 340 are made thinner, the floating gate transistor 200 may be programmed instead by Fowler-Nordheim tunneling of electrons from the body region 320, source/drain region 310 or 315, or source/drain region 319.

Addressing a particular memory cell 205 for reading data includes selecting a particular one of source/drain interconnection lines XD1, XD2, . . . , XDN and also selecting a particular one of source/drain interconnection lines YS1T, YS1B, YS2T, YS2B, . . . , YSNT, YSNB. Addressing a particular floating gate transistor 200 within the particular memory cell 205 for reading data further includes selecting a particular one of gate lines XG1, XG2, . . . , XGN.

In one embodiment, reading data stored on a particular floating gate transistor 200 includes providing a voltage of approximately 5 volts, such as by X gate decoder 115, through a particular one of the gate lines XG1, XG2, . . . , XGN for the floating gate transistor 200. A voltage of approximately 0 Volts is provided, such as by Y source/drain decoder 120, through a particular one of first source/drain interconnection lines YS1T, YS1B, YS2T, YS2B, . . . , YSNT, YSNB, to the particular source/drain region 310 or 315 of the particular floating gate transistor 200. A particular one of source/drain interconnection lines XD1, XD2, . . . , XDN+1 that is switchably coupled to the source/drain region 319 of the floating gate transistor 200 is precharged to a positive voltage by a sense amplifier in X source/drain decoder 125, then coupled to the source/drain region 319 to determine the conductivity state of the floating gate transistor 200 between its source/drain region 310 or 315 and source/drain region 319.

If there are no electrons stored on the floating gate 325, the floating gate transistor 200 will conduct between its source/drain region 310 or 315 and source/drain region 319, decreasing the voltage of the particular one of source/drain interconnection lines XD1, XD2, . . . , XDN+1 toward that voltage of its source/drain region 310 or 315, e.g. toward a "low" binary logic level of approximately 0 Volts. If there are electrons stored on the floating gate 325, the floating gate transistor 200 will not conduct between its source/drain region 310 or 315 and source/drain region 319. As a result, the sense amplifier will tend to increase the voltage of the particular one of source/drain interconnection lines XD1, XD2, . . . , XDN+1 toward a positive voltage, e.g. toward a "high" binary logic voltage level.

In one embodiment, erasure of floating gate transistors 200 includes providing an erasure voltage difference of approximately between −10 and −12 Volts from a source/drain region 310 or 315 to a corresponding gate line XG1, XG2, . . . XGN. For example, a voltage of approximately 0 Volts is provided, such as by Y source/drain decoder 120, to source/drain regions 310 or 315 of floating gate transistors 200 that are interconnected by one or several first source/drain interconnection lines YS1T, YS1B, YS2T, YS2B, . . . , YSNT, YSNB. A voltage of approximately between −10 and −12 Volts is provided, such as by X gate decoder 115, through a corresponding one or several of the control gate lines XG1, XG2, . . . , XGN for the floating gate transistors 200 to be erased. As a result of the negative voltage applied to the control gate lines, electrons are removed from the corresponding floating gates 325 by Fowler-Nordheim tunneling, thereby erasing the data from ones of the floating gate transistors 200. In another example, a voltage of approximately between −5 and −6 Volts is applied to the control gate lines and a voltage of approximately between +5 and +6 Volts is applied to the source/drain regions 310 or 315 in order to obtain the erasure voltage difference of approximately between −10 and −12 Volts from a source/drain region 310 or 315 to a corresponding control gate line. The exact value of the erasure voltage difference will vary depending upon the physical dimensions of the floating gate transistor 200 and the thicknesses of gate dielectric 330 and intergate dielectric 340.

In one embodiment, the entire array 105 of floating gate transistors 200 is simultaneously erased by applying approximately between −10 and −12 Volts to each of gate lines XG1, XG2, . . . , XGN, and also applying 0 Volts to each of source/drain interconnection lines YS1T, YS1B, YS2T, YS2B, . . . , YSNT, YSNB. In another embodiment, one or more sectors of array 105 are simultaneously erased by selectively applying approximately between −10 and −12 Volts to one or more of gate lines XG1, XG2, . . . , XGN, and also applying 0 Volts to one or more of first source/drain interconnection lines YS1T, YS1B, YS2T, YS2B, . . . , YSNT, YSNB.

FIGS. 5–20 illustrate generally one embodiment of a method of forming memory array 105, through the use of plan and perspective view of the method. In this embodiment, the array 105 is formed using bulk silicon processing techniques and is described, by way of example, with respect to a particular technology having a minimum feature size F, which is also sometimes referred to as a critical dimension (CD), of 0.4 micron. However, the process steps described below can be scaled accordingly for other minimum feature sizes without departing from the scope of the invention.

Figure 5:
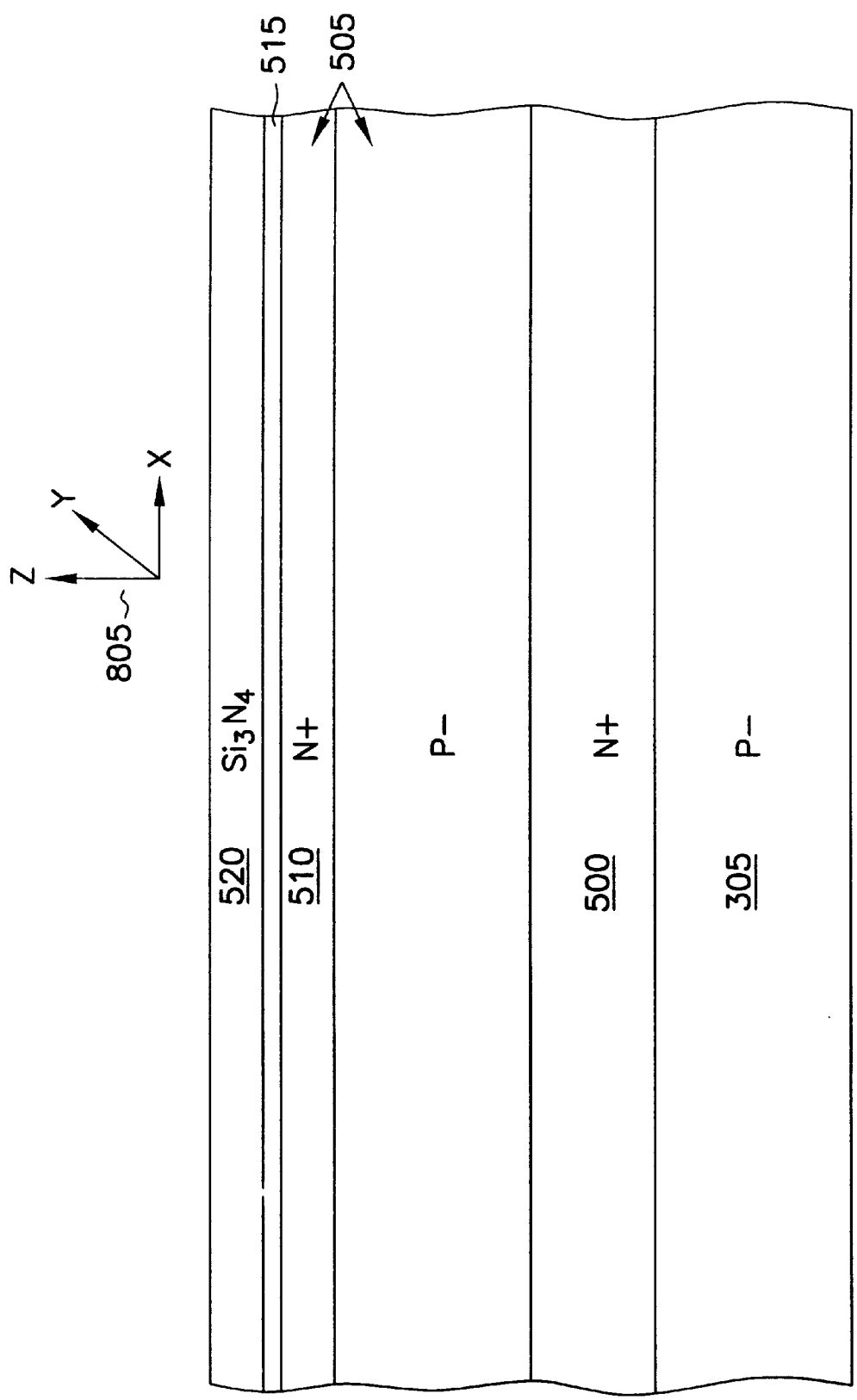
FIGS. 5–19 illustrate generally various stages of one embodiment of a method of forming an array of memory cells according to the teachings of the invention.

In FIG. 5, a P− silicon starting material is used for substrate 305. A first source/drain layer 500, of approximate thickness between 0.2 micron and 0.5 micron, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P− silicon of 0.6 micron approximate thickness, is formed, such as by epitaxial growth. A second source/drain layer 510, such as N+ silicon of 150 nanometer approximate thickness, is formed at a surface of the epitaxial layer 505, such as by ion-implantation of donor dopants into P− epitaxial layer 505 or by epitaxial growth of N+ silicon on P− epitaxial layer 505. The second source/drain layer 510 may alternatively be formed by implanting arsenic after growing an additional 0.1–0.2 micron of P− silicon. A thin layer of silicon dioxide ($SiO_2$), referred to as pad oxide 515, is deposited on the second source/drain layer 510 for stress relief. Pad oxide 515 has a thickness of approximately 10 nanometers. A layer of silicon nitride ($Si_3N_4$), referred to as pad nitride 520, is deposited on the pad oxide 515. Pad nitride 520 has a thickness of approximately 200 nanometers. N+ silicon layer 500 serves as the bottom Y-address lines (that is, the source/drain interconnection lines YS1B, YS2B, . . . , YSNB), while N+ silicon layer 510 serves as the top Y-address lines (that is, the source/drain interconnection lines YS1T, YS2T, . . . , YSNT).

Figure 6:
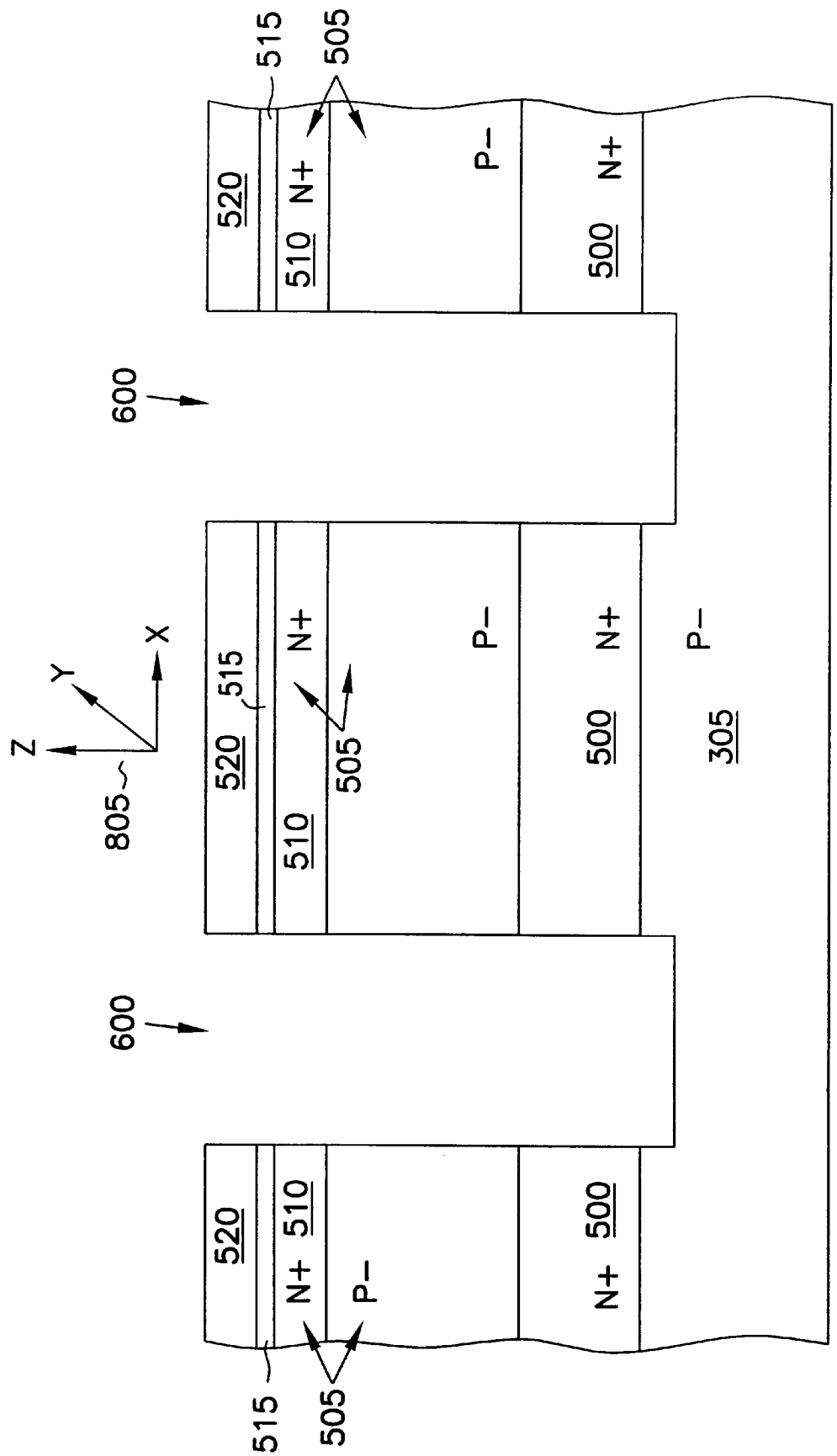

In FIG. 6, photoresist masking and selective etching techniques are used to form, in the first direction (e.g., the Y direction, which is perpendicular to the plane of the drawing of FIG. 6, as shown by axis 805), a plurality of substantially parallel first troughs 600 that extend through the pad nitride 520, pad oxide 515, second source/drain layer 510, the underlying portion of epitaxial layer 505, first source/drain layer 510, and flush with or partially into substrate 305. The photoresist is then removed.

Figure 7:
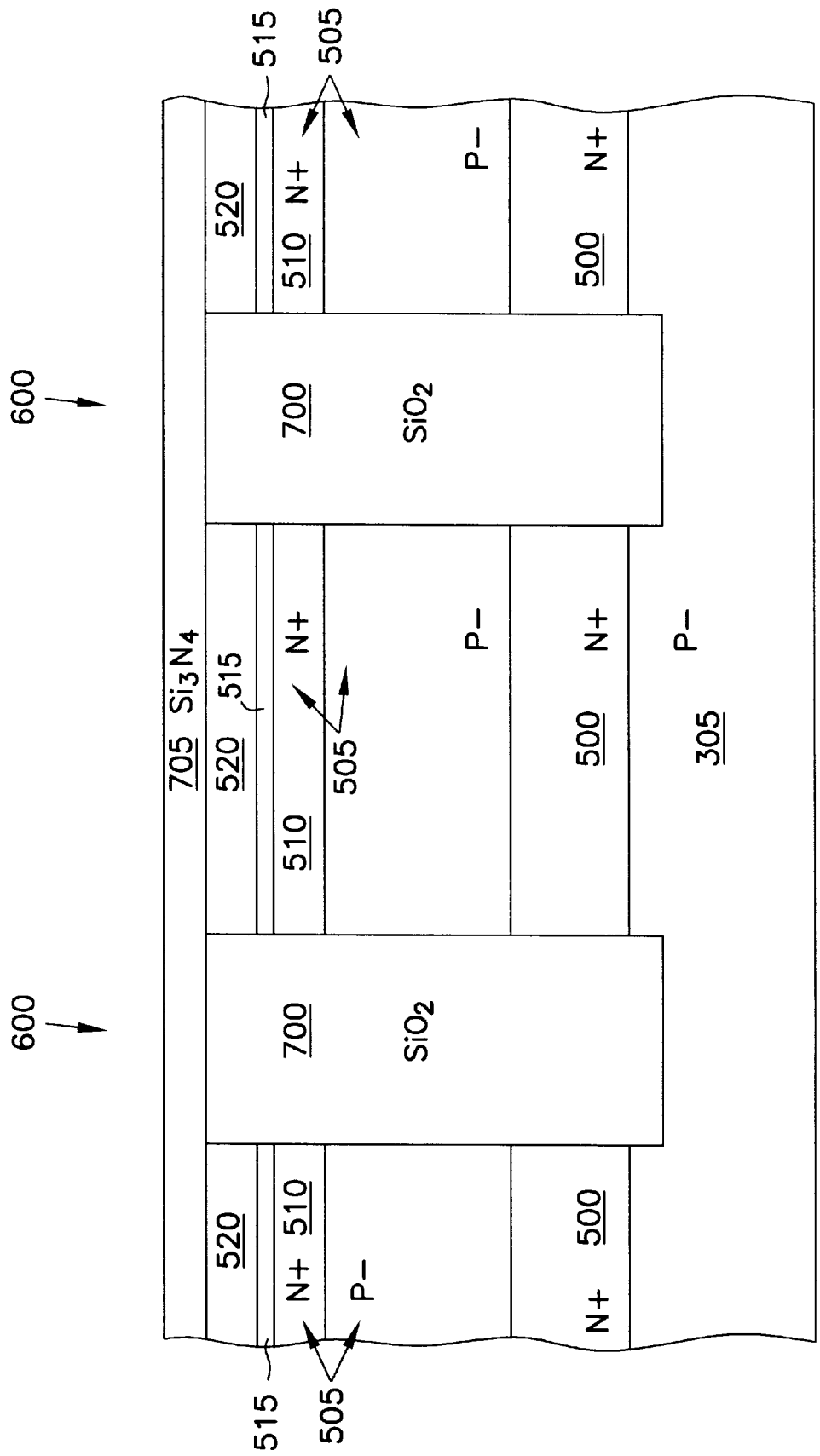

In FIG. 7, each trough is filled with silicon dioxide 700 as deposited by chemical vapor deposition (CVD). The resulting silicon dioxide 700 is planarized, such as by chemical mechanical polishing (CMP). An additional silicon nitride layer 705 is then deposited by CVD, at a thickness of about 0.1 micron.

Figure 8:
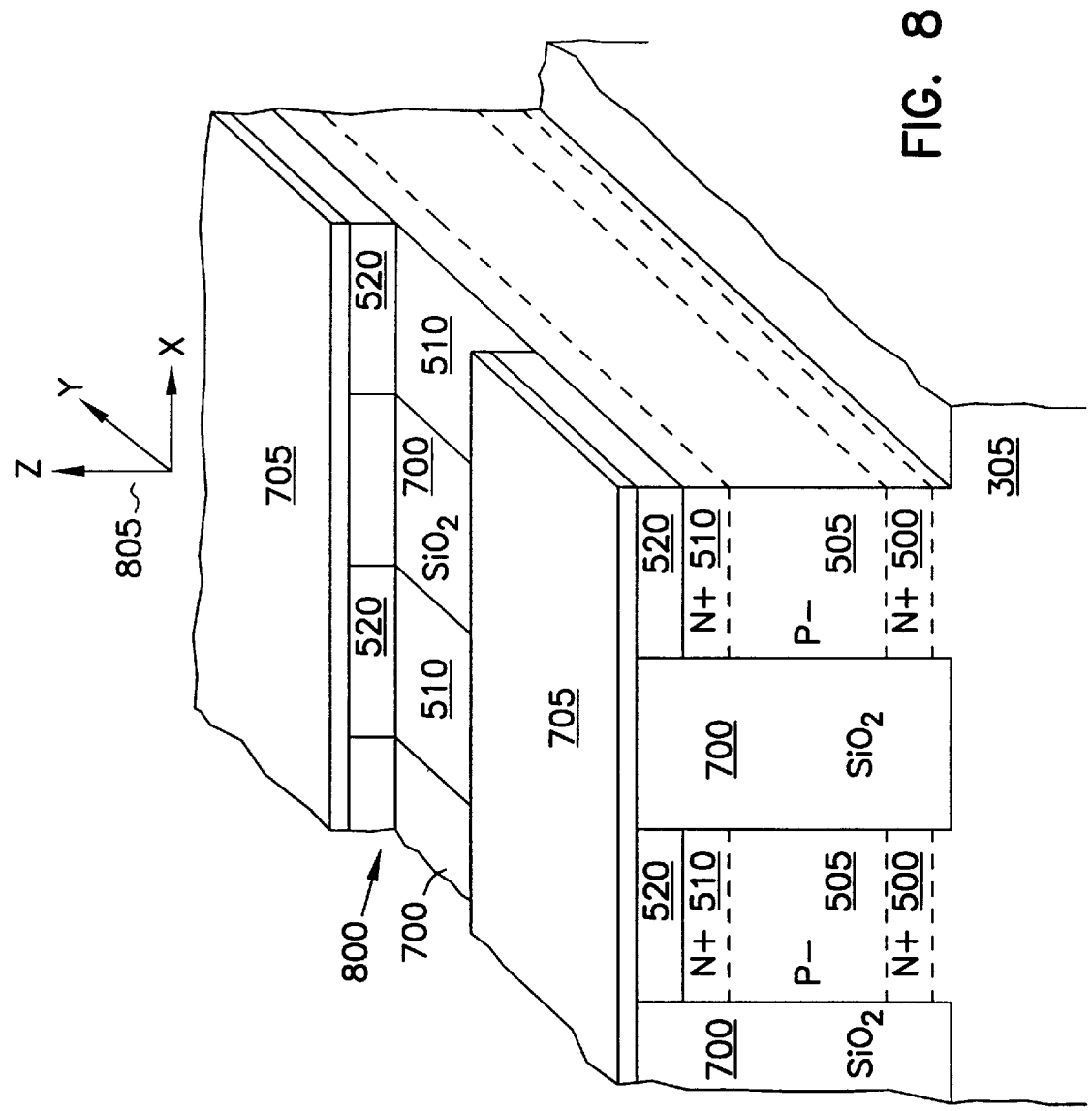

In FIG. 8, a perspective view is shown, where photoresist masking and selective etching is used to form an orthogonal stripe 800 in the second direction (e.g., the X direction, as shown by axis 805). The depth of the stripe 800 should reach the N+ silicon layer 510. That is, the stripe should be etched about 0.2 micron deep.

Figure 9:
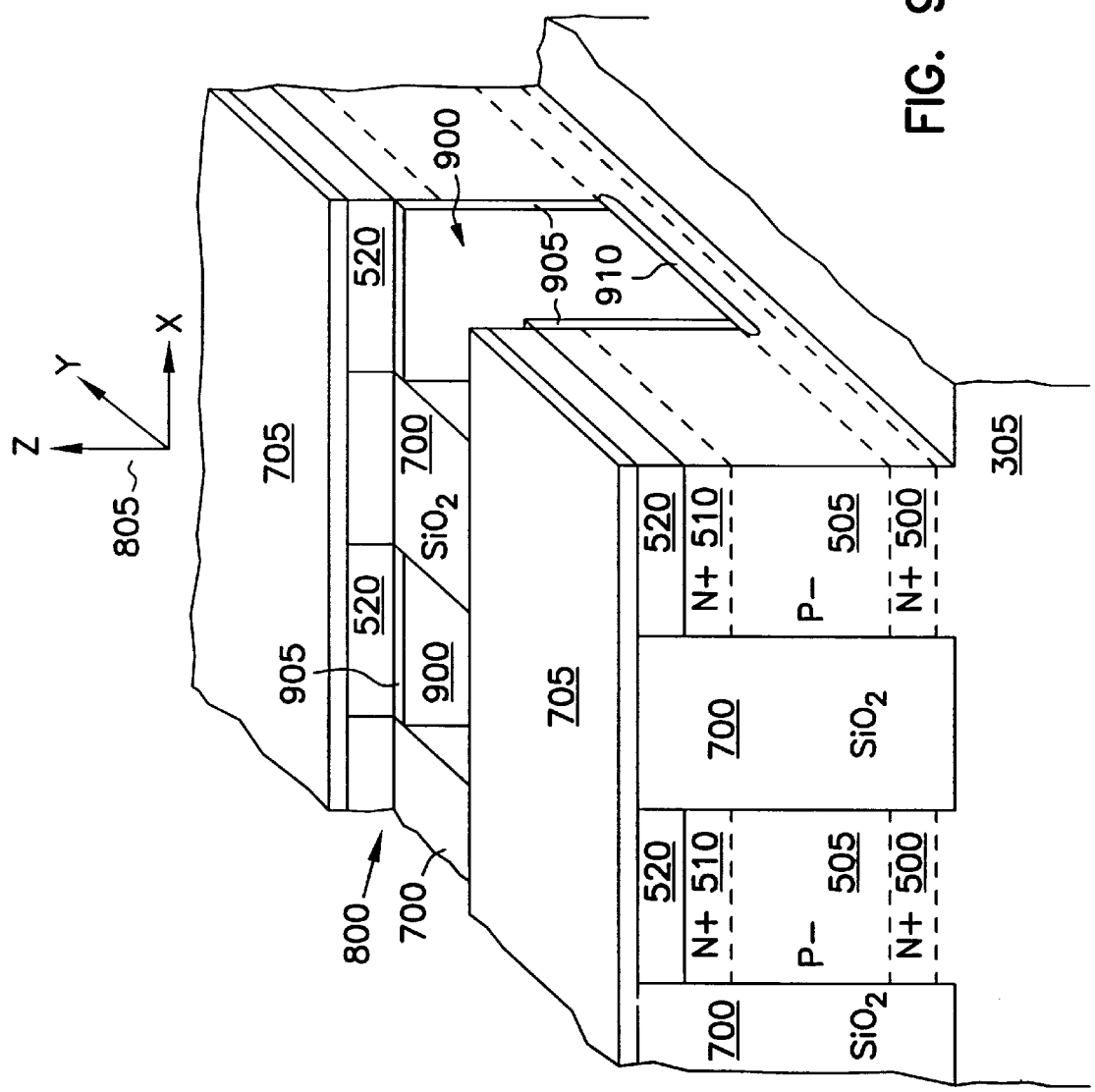

In FIG. 9, the N+ silicon layer 510 and the P- silicon layer 505 are selectively etched to a sufficient depth to reach the underlying N+ silicon layer 500. Note that the silicon dioxide 700 is not etched. The selective etching of layers 510 and 505 to reach layer 500 results in cavities 900. Silicon nitride 905, at a thickness of about 0.01 micron, is deposited by CVD on the walls of cavities 900 to protect against oxidation. The nitride 905 is directionally removed by reactive ion etching (RIE) so that it is left only on the vertical sidewalls of cavities 900. A bottom insulation layer 910 of silicon dioxide is formed on the bottoms of cavities 900 by thermal oxidation of the exposed bottom portions of cavities 900.

Figure 10:
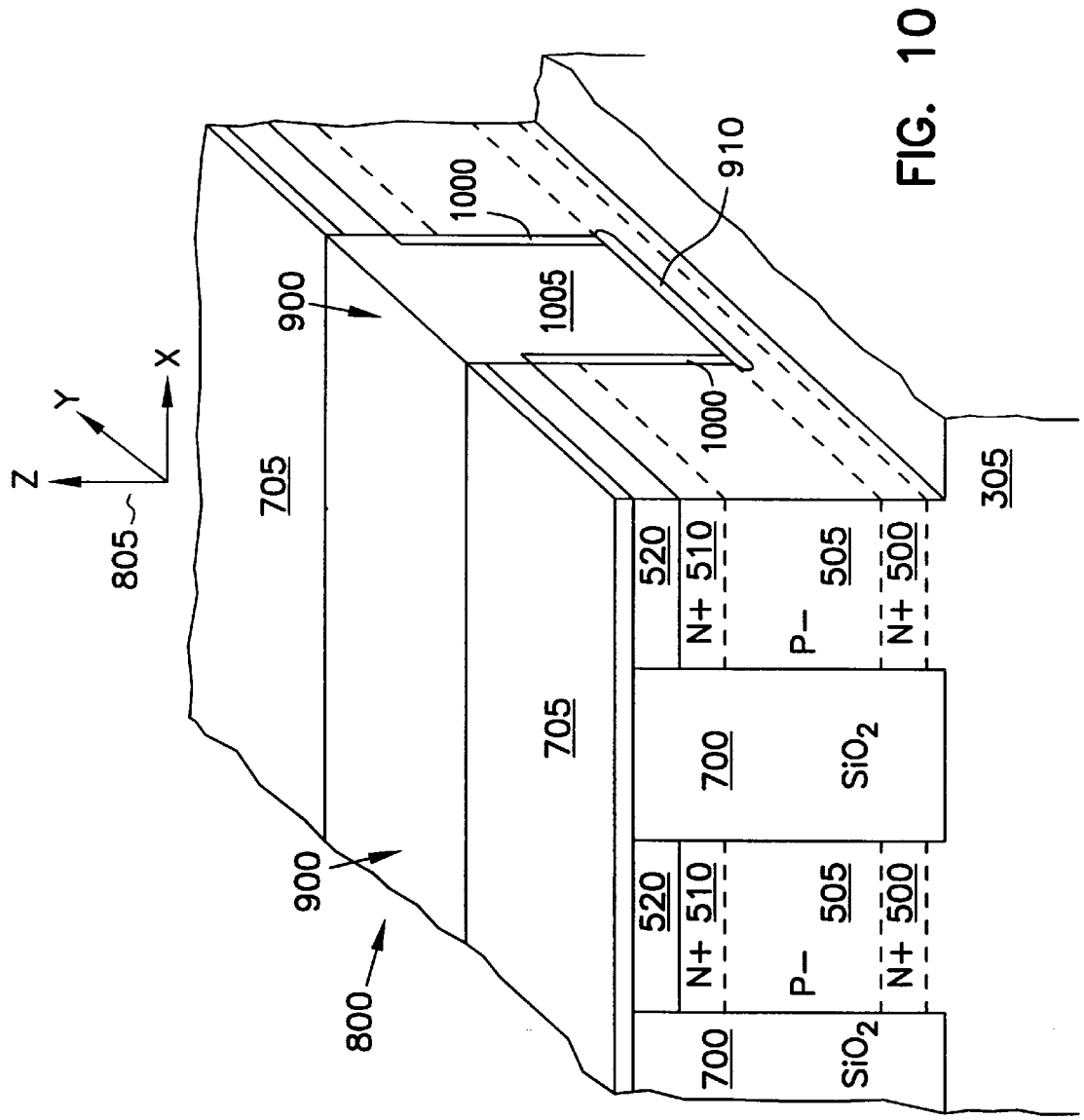

In FIG. 10, the layers of silicon nitride 905 are dipped off in an etchant bath, and a layer of tunnel thermal oxide 1000 is grown on the vertical sidewalls of cavities 900 in their place. The trough 800 and the cavities 900 are filled by N+ polysilicon 1005 deposited by CVD, and then planarized such as by CMP.

Figure 11:
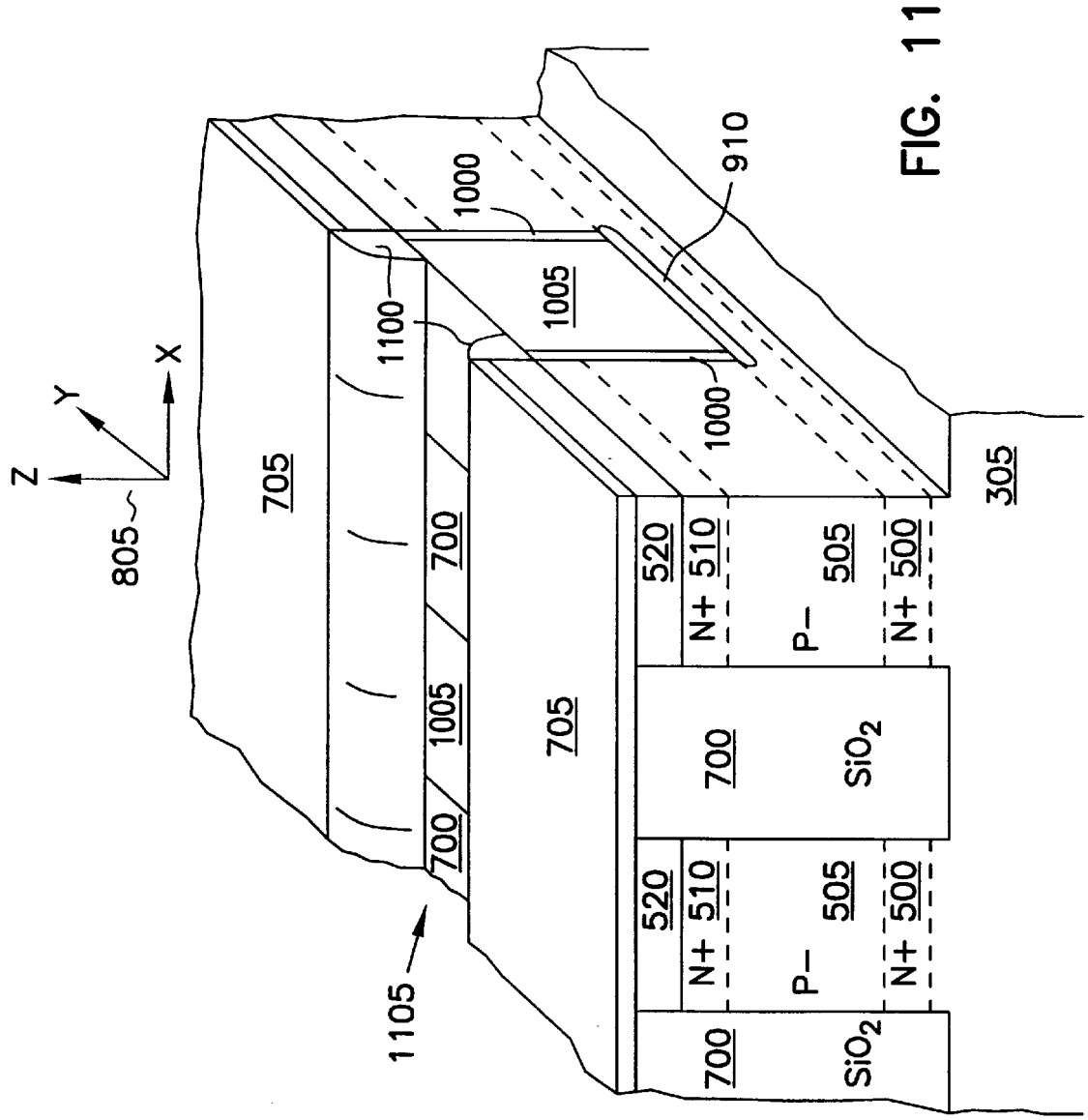

In FIG. 11, the N+ polysilicon 1005 previously deposited is etched to a depth so that it reaches the layer of silicon dioxide 700, which is about the depth of the silicon nitride pad 520 (about 0.2 micron) plus the depth of the additional silicon nitride layer 705 (about 0.1 micron), or about 0.3 micron. The etching of N+ polysilicon 1005 results in the formation of a channel 1105 in the second direction (e.g., the X-direction, as shown by axis 805). Silicon nitride is deposited by CVD and anistropically etched by RIE to leave nitride spacers 1100 along the sidewalls of channel 1105. Furthermore, the layer of tunnel thermal oxide 1000 is directionally etched to approximately the thickness of the bottom layer of thermal oxide 910.

Figure 12:
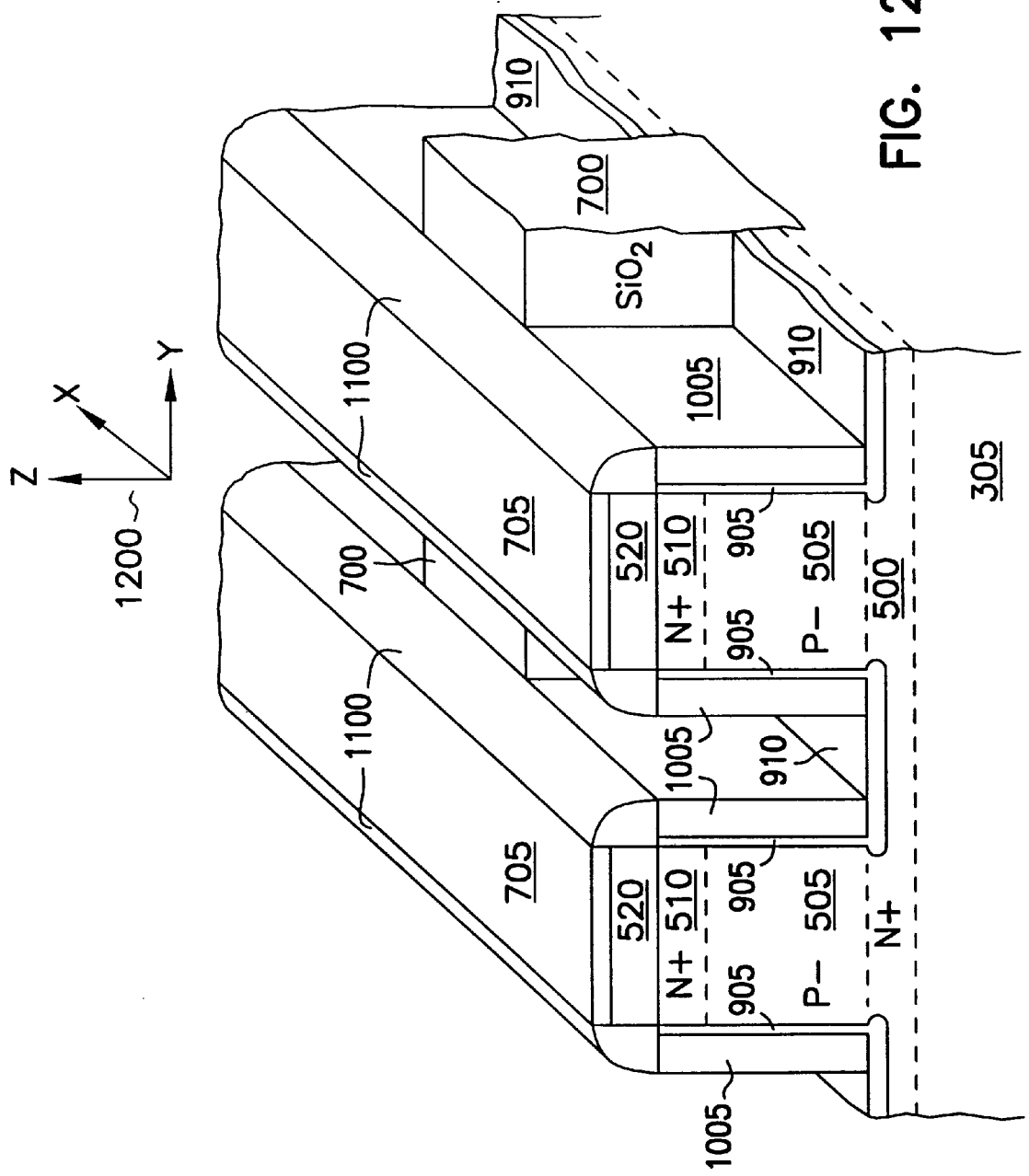

In FIG. 12, the N+ polysilicon 1005 is selectively etched until the bottom layer of thermal oxide 910 is reached. Note that this results in N+ polysilicon 1005 remaining along the sidewalls underneath spacers 1100, the spacers 1100 serving as an overhang mask so that the polysilicon 1005 underneath them is not etched away. N+ polysilicon 1005 is the polysilicon gates of the transistors being created. Note that the perspective view of FIG. 12 has been rotated ninety degrees from that of FIG. 11 and previous figures, as shown by axis 1200.

Figure 13:
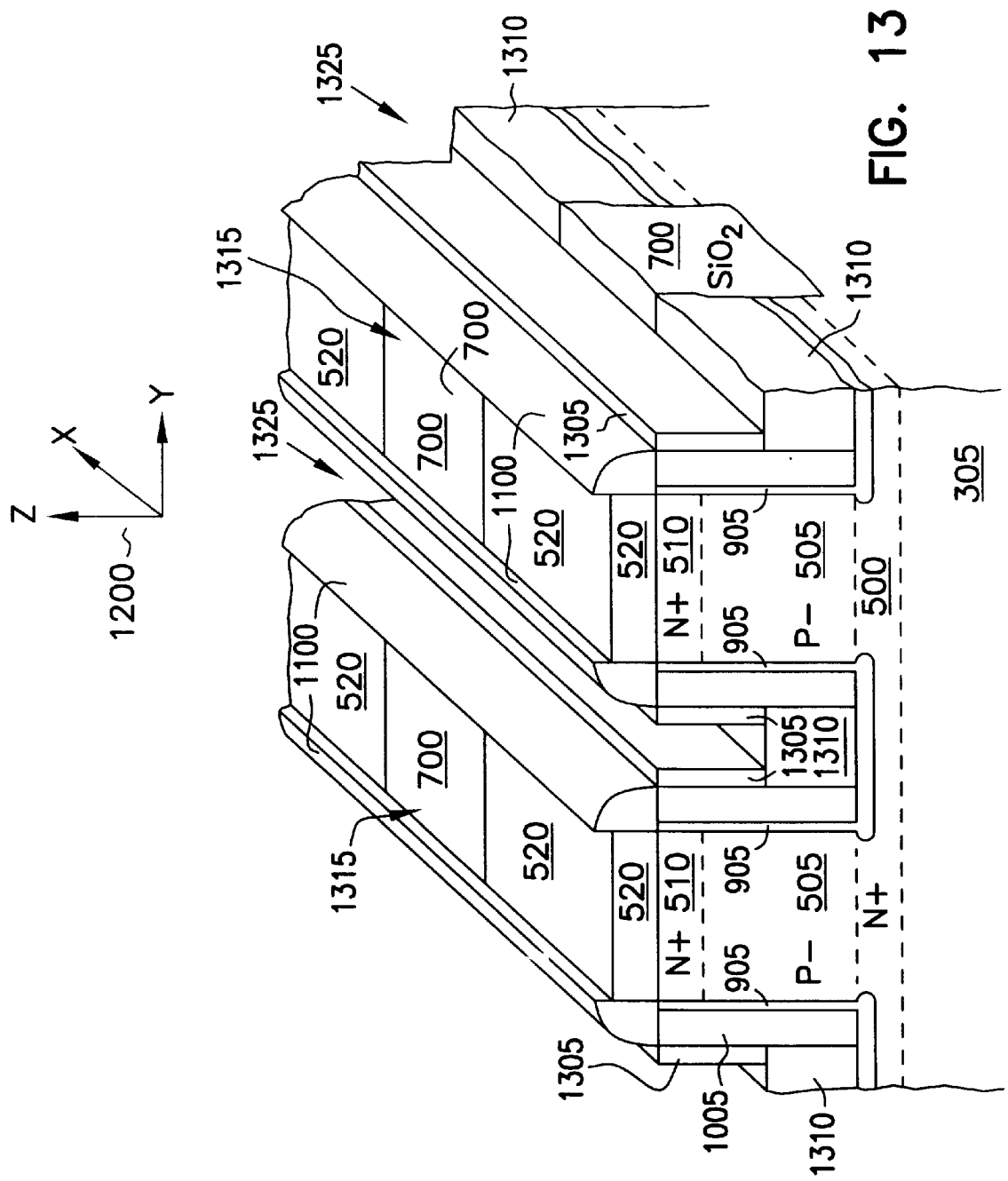

In FIG. 13, nitride layer 705 is etched away to expose silicon dioxide 700 between pillars of silicon 510—that is, to create cavities 1315 over silicon dioxide 700. Silicon dioxide 1310 is then deposited by CVD in the troughs 1325 between N+ polysilicon 1005 as well as cavities 1315, and planarized, such as by CMP. The oxide layers (silicon dioxide 700 and silicon dioxide 1310) are selectively etched to about half their previous height. A thin nitride layer 1305 is deposited on the top surface of the oxide layers (silicon dioxide 700 and silicon dioxide 1310), and the exposed side surfaces of N+ polysilicon 1005 (that is, their sidewalls). The nitride layer 1305 is directionally etched such that it remains only on the sidewalls of N+ polysilicon 1005, and not on the top surface of the oxide layers (silicon dioxide 700 and silicon dioxide 1310).

Figure 14:
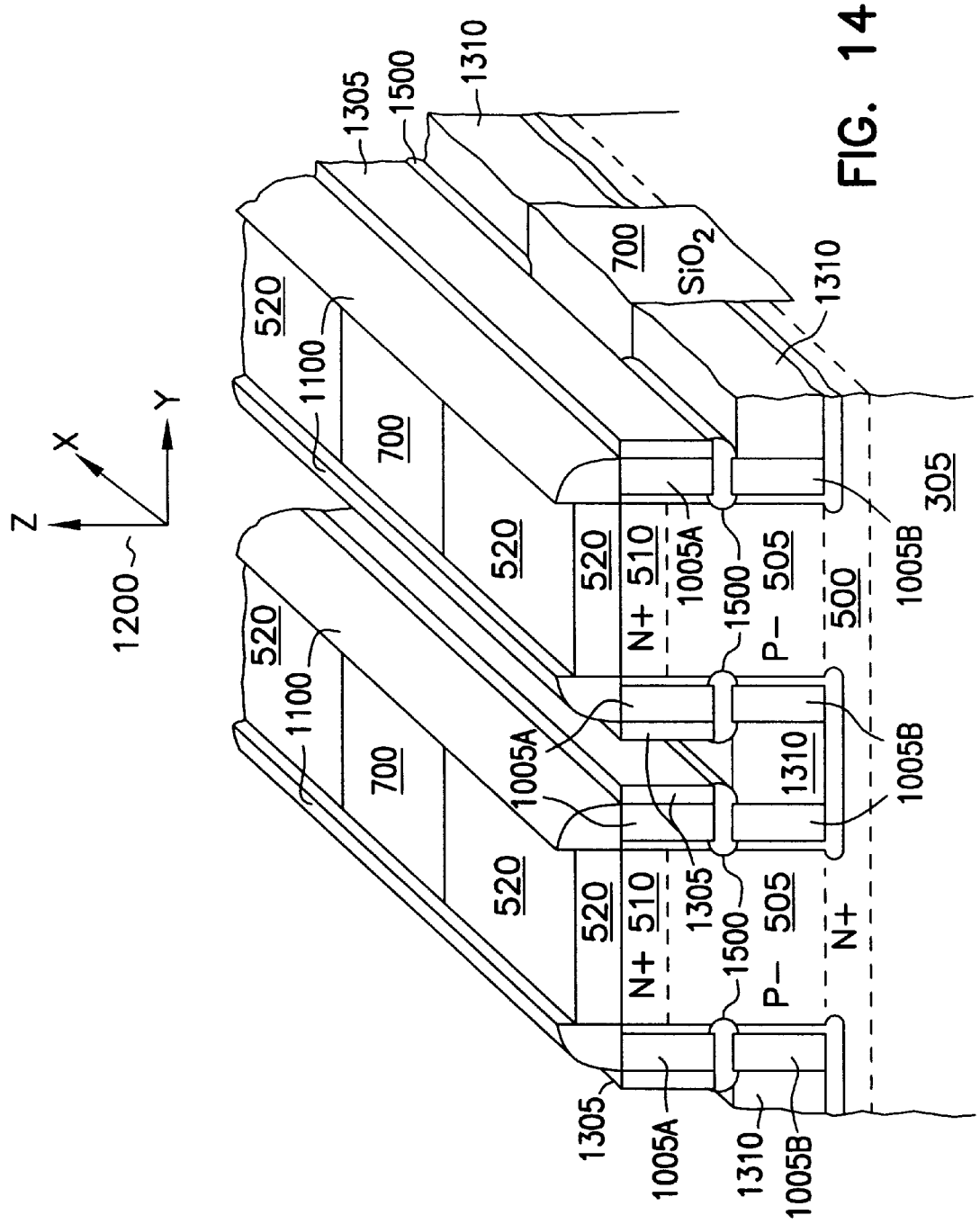

In FIG. 14, the oxide layers (silicon dioxide 700 and silicon dioxide 1310) are selectively etched further, below the bottom of nitride layer 1305, to create a gap in N+ polysilicon 1005. The revealed gap of N+ silicon 1005 is isotopically etched, which separates the silicon into two floating silicon gates, 1005A and 1005B. The isotropical etching is selective to N+ polysilicon only. N+ dopant source is deposited by CVD between the two floating silicon gates 1005A and 1005B, the dopant thus adjacent to exposed sidewalls of P- silicon 505 (exposed as a result of the etching of polysilicon 1005 into two silicon gates 1005A and 1005B). In one embodiment, the N+ dopant is 100 nanometers of either phosphosilicate glass (PSG) or arsenisilicate glass (ASG). N+ dopant is then thermally driven into the exposed sidewalls of P- silicon 505 as pockets within P- silicon 505, resulting in an N+ silicon region 1500. The excess N+ dopant and the nitride layer 1305 are removed by wet etching. N+ silicon region 1500 forms a third source/drain region within P- silicon region 505.

Figure 15:
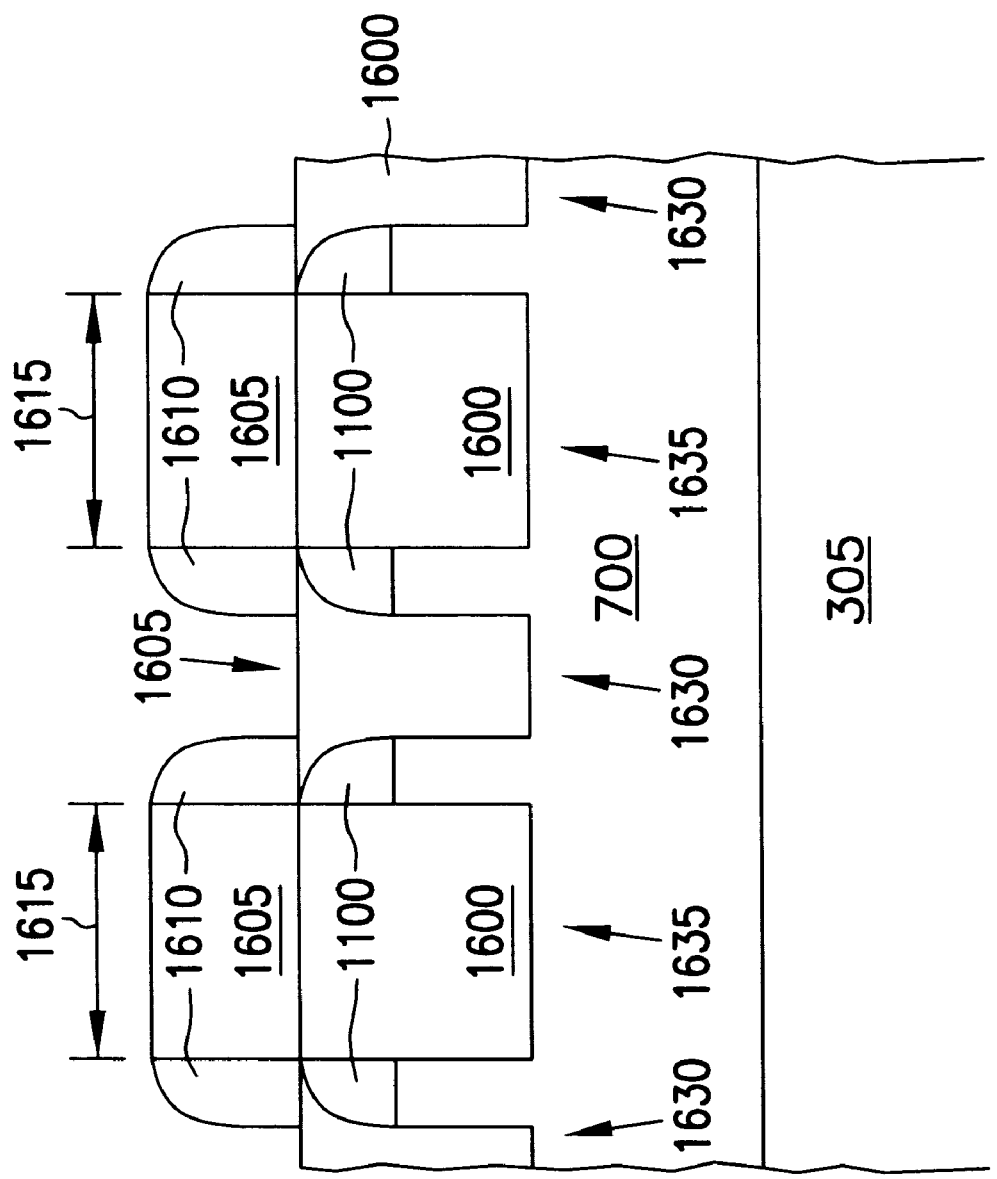

FIG. 15 is a cross-sectional view in the Y-direction across silicon dioxide 700. Intrinsic polysilicon layer 1600 is formed by CVD, and planarized, such as by CMP. A thick layer of masking material 1605, such as doped polysilicon, is deposited across the planarized polysilicon layer 1600. Resist is applied, exposed through a mask, and the thick layer of masking material 1605 is etched and the resist stripped so that parallel stripes of masking material 1605 remain over the length 1615 as is shown. The length 1615 corresponds to the widths of the pillars 300 formed from the silicon 505 and 510, as previously described, but not shown in FIG. 15. Another layer of masking material 1610 is deposited by CVD, and is directionally etched to remain as a spacer on the edges of masking material 1605. The width of the masking material 1610 as the spacer on the edges of masking material 1605 is slightly greater than the width of nitride spacer 1100. The unmasked (exposed) polysilicon layer 1600 corresponds to the X-address channels 1630 (that is, the control gate line channels for gate control lines XG1, XG2, . . . , XGN); the masked (not exposed) polysilicon layer 1600 will be used later to form the common data lines (that is, the source/drain interconnection lines XD1, XD2, . . . , XDN+1). The exposed instrinsic polysilicon layer 1600 is isotopically etched to remove all the polysilicon from the X-address channels. The masking material 1605 and 1610 are then removed, by CMP if the masking material is doped polysilicon, or otherwise etched off selectively. The remaining intrinsic polysilicon layer 1600 will become the common data lines 1635 of the device, after further processing.

Figure 16:
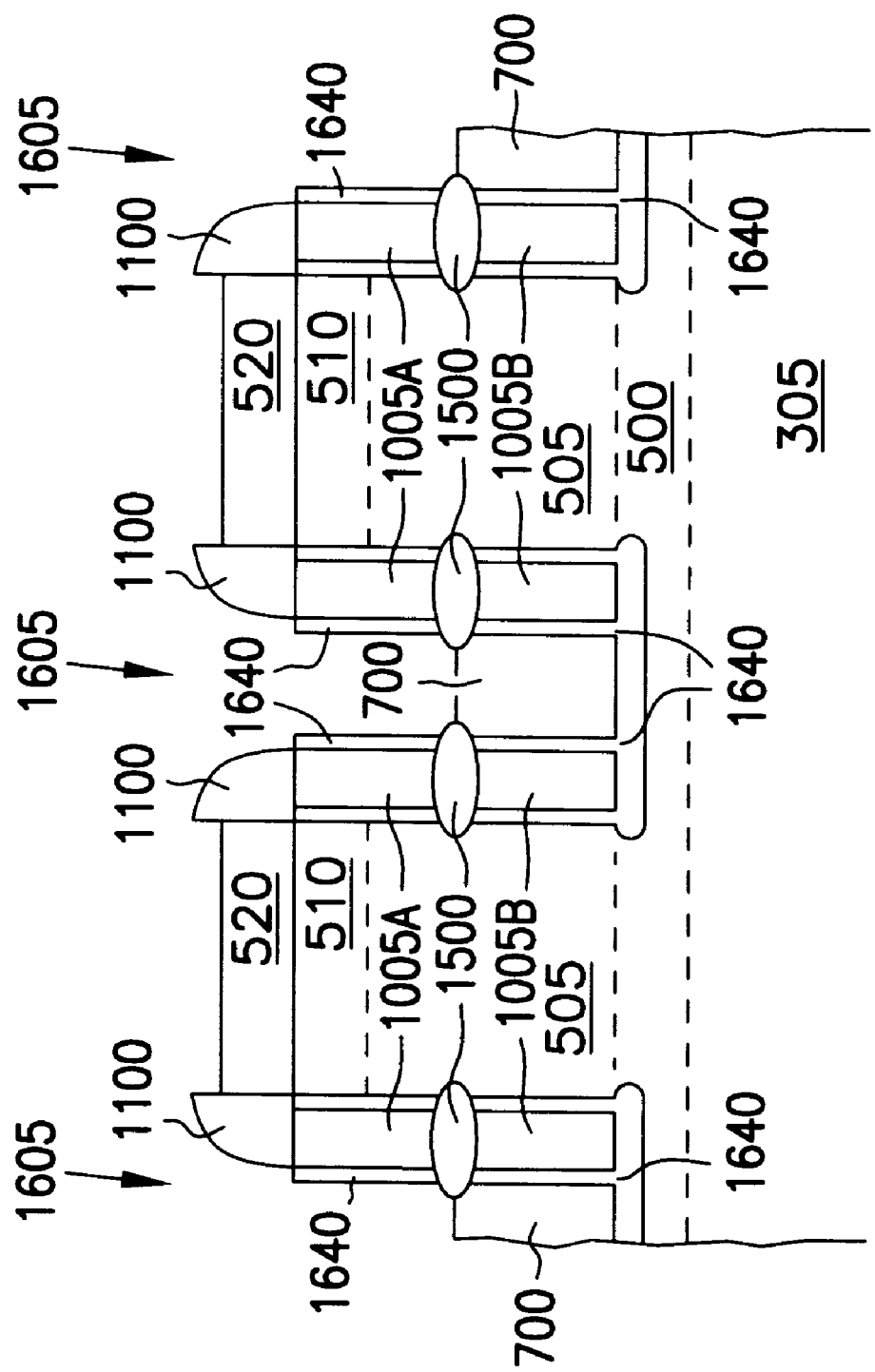

FIG. 16 is a cross-sectional view in the Y-direction across the floating gates 1005A and 1005B. The remaining silicon dioxide 700 that covers the lower floating gates 1005B is timed directionally selectively etched to expose the lower floating gates 1005B. Therefore, both upper floating gates 1005A and lower floating gates 1005B are now exposed within the X-address channels 1605. A layer of thermal oxidation 1640 is also grown, at a thickness of about 10 nanometers, to cover the exposed surfaces of floating gates 1005A and 1005B. Thermal oxidation 1640 is the intergate dielectric.

Figure 17:
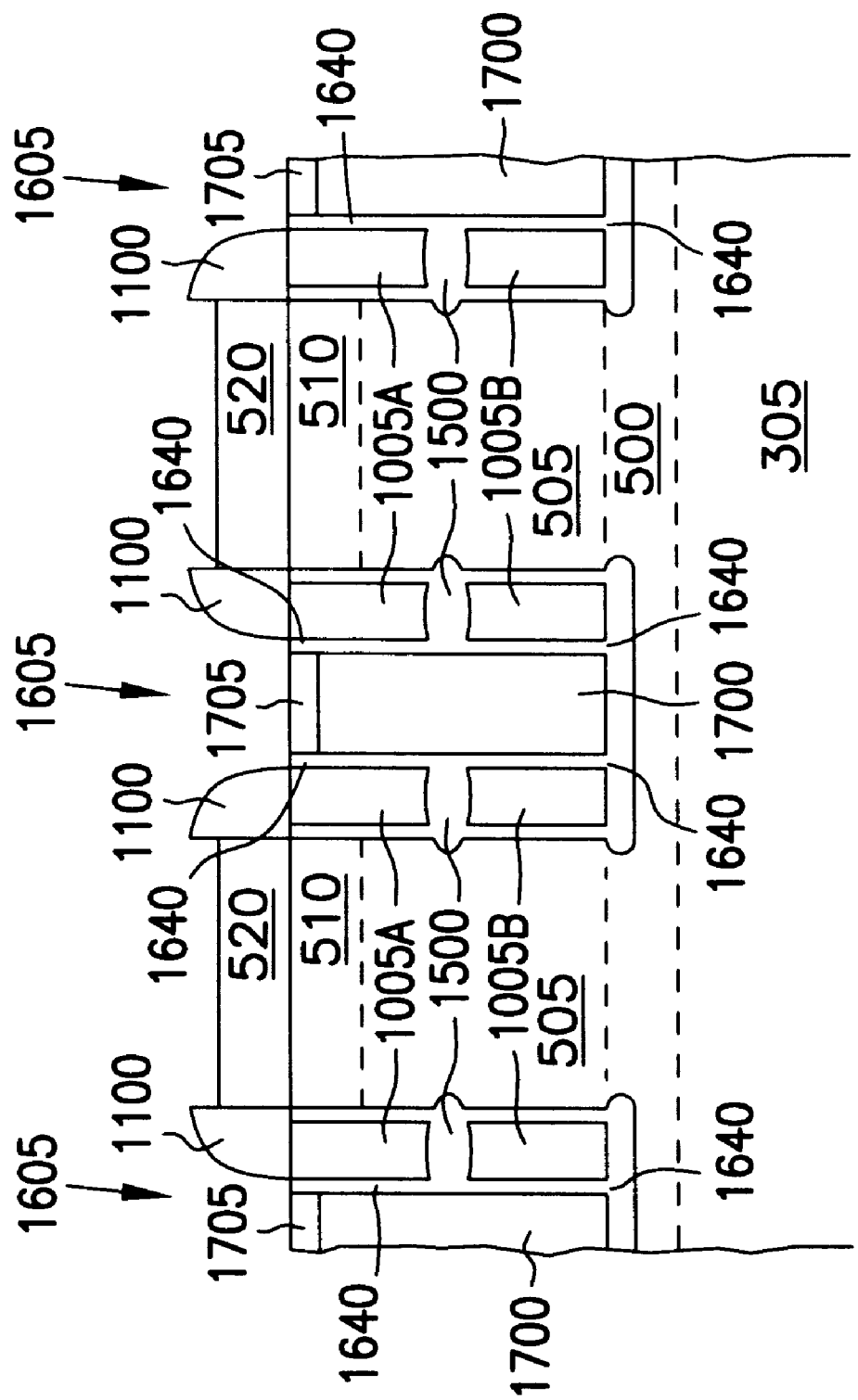

FIG. 17 is also a cross-sectional view in the Y-direction across the floating gates 1005A and 1005B. N+ doped polysilicon 1700 is deposited, by CVD, within X-address channels 1605 to act as the X-address lines (that is, the control gate lines XG1, XG2, . . . , XGN). N+ doped polysilicon 1700 is planarized, such as by CMP or RIE, to a level flush with the bottom of nitride 1100. The polysilicon 1700 is further etched by RIE to decrease its height by 0.1 micron—that is, 0.1 micron below the level of the bottom of nitride 1100. An oxide layer 1705 is deposited on top of polysilicon 1700 by CVD, and then planarized by CMP or RIE to a level flush with the bottom of nitride 1100. The oxide layer 1705 therefore caps the polysilicon 1700.

Figure 18:
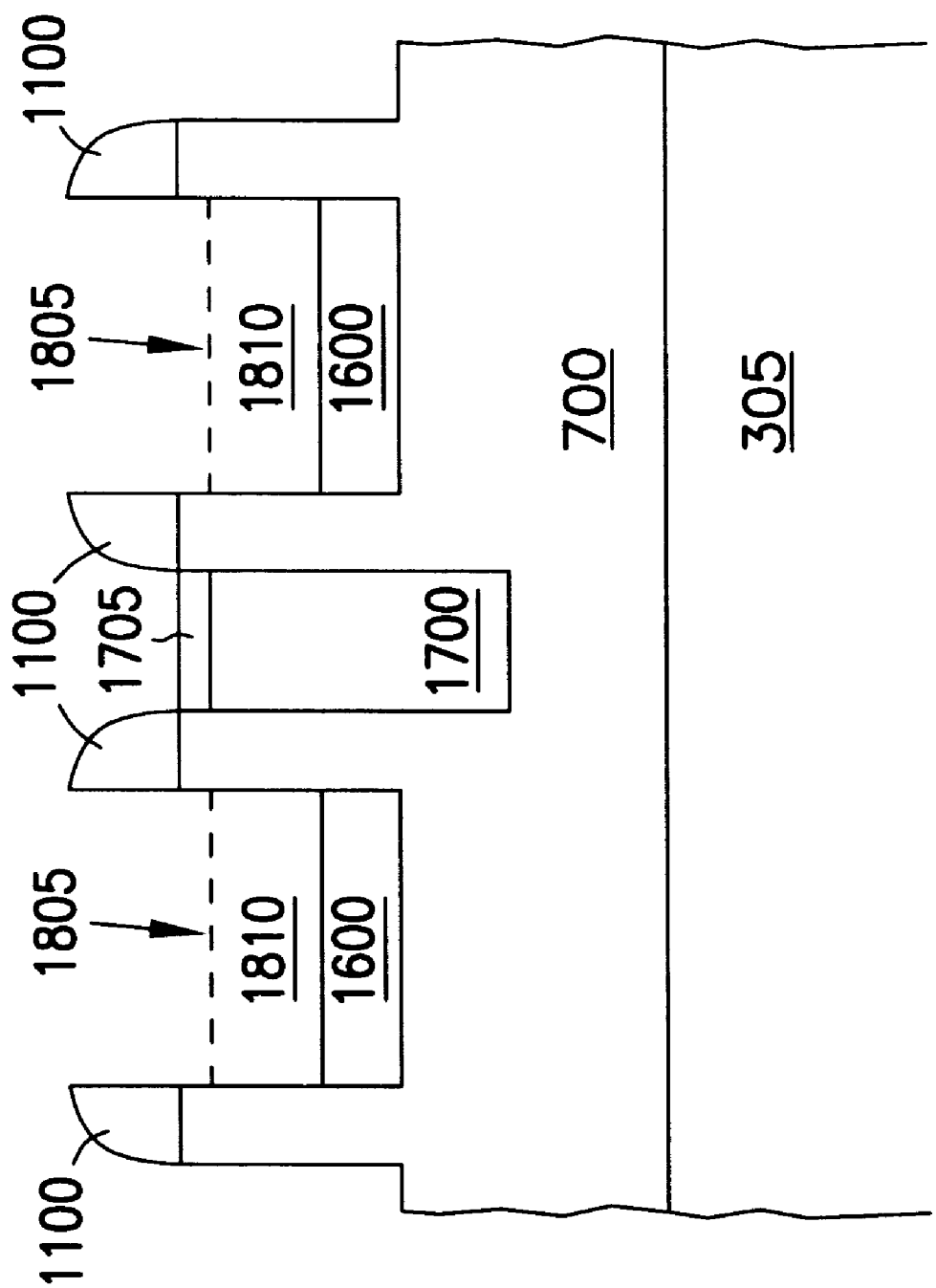

FIG. 18 is a cross-sectional view in the Y-direction across silicon dioxide 700. The polysilicon layer 1600 is etched by RIE to approximately one-third its former height. Thus, polysilicon layer 1600 decreases in height from being flush with the bottom of nitride 1100, such that it creates channels 1805. Polysilicon layer 1600 is implanted with N+ ions for doping. The remaining polysilicon layer 1600 after etching and doping constitutes the common date lines (that is, the source/drain interconnection lines XD1, XD2, . . . , XDN+1) of the device. A layer of silicon dioxide 1810 is deposited over the remaining polysilicon layer 1600 by CVD, and planarized by CMP and recessed by RIE to a level flush with the bottom of nitride 1100.

Figure 19:
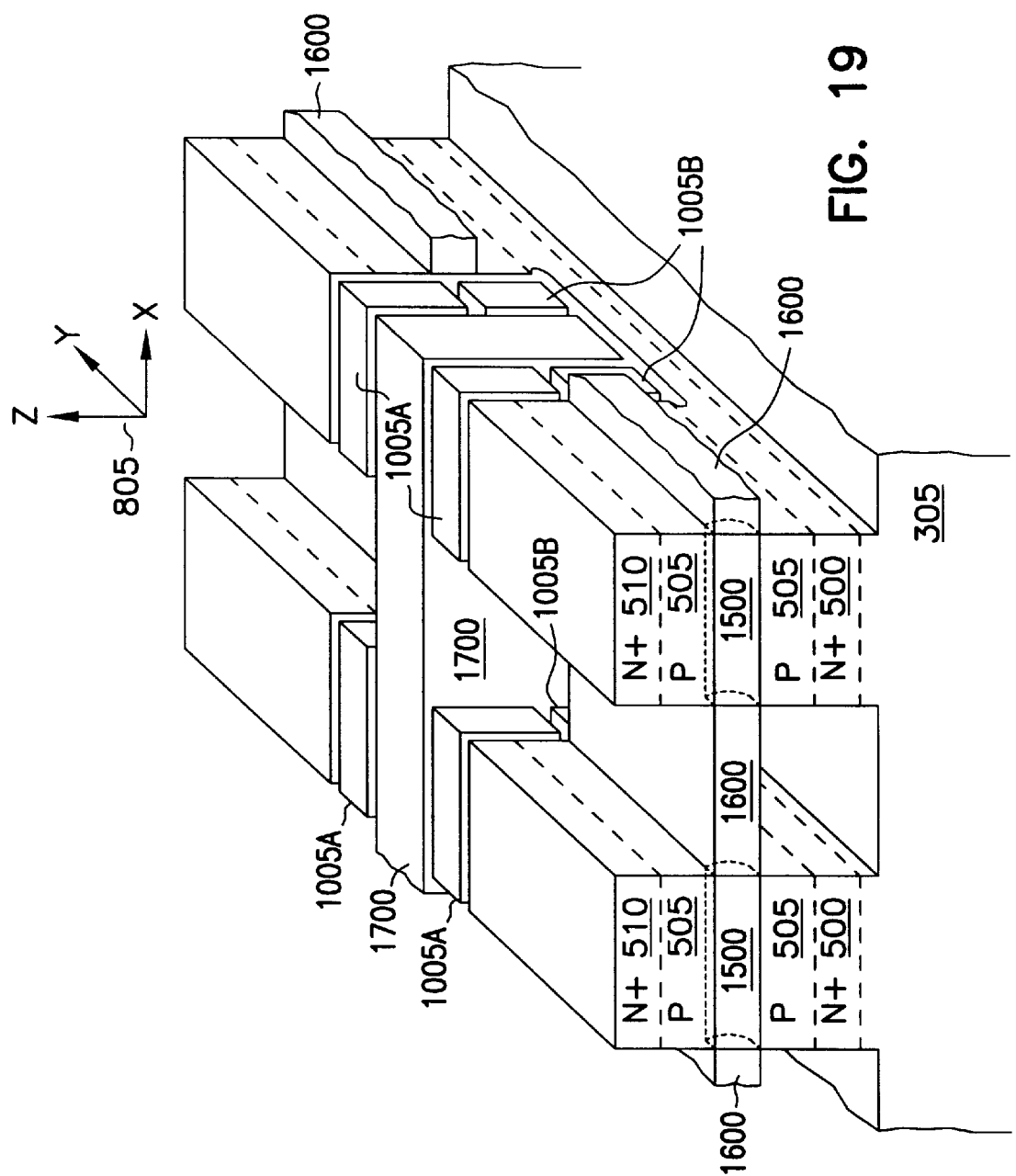

FIG. 19 is a perspective view of the finished device. Nitride 520, and 1100 are etched away by dipping in an etchant solution, and therefore are not shown in FIG. 19. Silicon dioxide 700 and 1810 are also not shown for clarity. As previously described, polysilicon 1700 is the X-address lines (that is, the control gate lines XG1, XG2, . . . , XGN) for the device. Polysilicon layer 1600 is the common data lines (that is, the source/drain interconnection lines XD1, XD2, . . . , XDN+1) connected by third source drain region 1500. N+ silicon 510 is the top Y-address lines (that is, the top source/drain interconnection lines YS1T, YS2T, . . . , YSNT), and N+ silicon 500 is the bottom Y-address line (that is, the bottom source/drain interconnection line YS1B, YS2B, . . . , YSNB). The top Y-address lines and the common data lines are connected together by conductors as has been described (not shown in FIG. 19). The top floating gates 1005A and the bottom floating gates 1005B are situated between the polysilicon 1700 acting as the X-address lines, and the P- silicon 505 as is shown.

Though FIGS. 5–19 illustrate generally one embodiment of forming the memory array 105 using bulk silicon processing techniques, in another embodiment a semiconductor-on-insulator (SOI) substrate is formed from substrate 305. In one such embodiment, a P- silicon starting material is used for substrate 305, and processing proceeds similarly to the bulk semiconductor embodiment described in FIGS. 5–7. However, after the oxide layer 700 is formed in FIG. 7, an isotropic chemical etch is used to fully undercut the semiconductor regions separating the first troughs 600, and a subsequent oxidation step is used to fill in the evacuated regions formed by the undercutting. As a result, an insulator is formed on the bottoms of first troughs 600, bars of SOI are formed between first troughs 600, and the topography on the working surface of substrate 305 is separated from substrate 305 by an insulating layer 2100 illustrated in the perspective view of FIG. 20.

Thus, in the above described Figures, substrate 305 is understood to include bulk semiconductor as well as SOI embodiments in which the semiconductor integrated circuits formed on the surface of substrate 305 are isolated from each other and an underlying semiconductor portion of substrate 305 by an insulating layer.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Thus, embodiments of the present invention provide an ultra high density flash EEPROM having increased nonvolatile storage capacity. If a floating gate transistor 200 is used to store a single bit of data, an area of only $F^2$ is needed per bit of data. If multiple charge states (more than two) are used, an area of less than $F^2$ is needed per bit of data. The increased storage capacity of the ultra high density flash EEPROM is particularly advantageous in replacing hard disk drive data storage in computer systems. In such an application, the delicate mechanical components included in the hard disk drive are replaced by rugged, small, and durable solid-state ultra high density flash EEPROM packages. The ultra high density flash EFPROMs provide improved performance, extended rewrite cycles, increased reliability, lower power consumption, and improved portability.

It is to be understood that the above description is intended to be illustrative, and not restrictive. Many other embodiments will be apparent to those of skill in the art upon reviewing the above description. It is also understood that the above structures and methods, which have been described with respect to EEPROM memory devices having floating gate transistors 200, are also applicable to dynamic random access memories (DRAMs) or other integrated circuits using vertically oriented field-effect transistors (s) that do not have floating gates. Thus, the scope of the invention is not limited to the particular embodiments shown and described herein.

What is claimed is:

1. A memory cell, comprising:

a pillar of semiconductor material extending outwardly from a working surface of a substrate to form source/drain and body regions, the pillar having a number of sides;

at least one pair of vertically stacked floating gates, each pair associated with a side of the pillar, a dielectric disposed between the floating gates within each pair; and one or more control gates, each control gate associated with at least one floating gate so as to allow selective storage and retrieval of data on the floating gates.

2. The memory cell of claim 1, wherein the substrate is a bulk semiconductor.

3. The memory cell of claim 1, wherein the working surface of the substrate includes an insulating layer formed on top of an underlying semiconductor.

4. The memory cell of claim 1, wherein the control gate is configured and arranged to store more than two charge states on its associated floating gate.

5. A memory device, comprising:

an array of memory cells, each cell including a number of transistors formed around a common pillar of semiconductor material that forms source/drain and body regions for the transistors and at least one pair of vertically stacked floating gates disposed adjacent to the sides of the pillar;

a plurality of control gate lines that are substantially parallel in a first direction, each control gate line allowing selective storage and retrieval of data on ones of the floating gates;

at least two source/drain interconnection lines, each source/drain interconnection line interconnecting ones of the source/drain regions of ones of the memory cells; and a plurality of data lines, each data line interconnecting ones of the source/drain regions of ones of the memory cells.

6. The memory device of claim 5, wherein the pillar extends outwardly from a bulk semiconductor substrate.

7. The memory device of claim 5, wherein the pillar extends outwardly from an insulating layer portion formed on top of an underlying semiconductor substrate.

8. A memory cell that is fabricated upon a substrate, the memory cell comprising:
- a semiconductor pillar of a first conductivity type formed upon the substrate and having top and side surfaces;
- a first source/drain region, of a second conductivity type, formed proximal to an interface between the pillar and the substrate;
- a second source/drain region, of the second conductivity type, formed in a portion of the pillar that is distal to the substrate and separate from the first source/drain region;
- a third source/drain region, of the second conductivity type, formed in a portion of the pillar that is distal to the substrate and between the first and the second source/drain regions;
- a gate dielectric formed on at least a portion of the side surface of the pillar;
- at least one pair of vertically stacked floating gates, each pair substantially adjacent to a portion of the side surface of the pillar and separated therefrom by the gate dielectric;
- one or more control gate lines, each of which is substantially adjacent to at least one of the floating gates and insulated therefrom; and
- an intergate dielectric, interposed between each of the substantially adjacent floating and control gate lines.

9. The memory cell of claim 8, wherein the substrate includes a bulk semiconductor from which the pillar outwardly extends.

10. The memory cell of claim 8, wherein the substrate includes an insulating layer from which the pillar outwardly extends.

11. A nonvolatile memory array that is fabricated upon a substrate, the memory array comprising:
- a plurality of memory cells, each memory cell including:
  - a semiconductor pillar of a first conductivity type formed upon the substrate and having top and side surfaces;
  - a first source/drain region, of a second conductivity type, formed proximal to an interface between the pillar and the substrate;
  - a second source/drain region, of the second conductivity type, formed in a portion of the pillar that is distal to the substrate and separate from the first source/drain region;
  - a third source/drain region, of the second conductivity type, formed in a portion of the pillar that is distal to the substrate and between the first and the second source/drain regions;
  - a gate dielectric, formed on at least a portion of the side surface of the pillar;
  - at least one pair of vertically stacked floating gates, each pair substantially adjacent to a portion of the side surface of the pillar and separated therefrom by the gate dielectric;
  - at least one control gate line, substantially adjacent to at least one of the floating gates and insulated therefrom; and
  - an intergate dielectric, interposed between each of the substantially adjacent floating gates and control gate lines;
- one or more first source/drain interconnection lines interconnecting ones of the first source/drain regions of ones of the memory cells;
- one or more second source/drain interconnection lines interconnecting ones of the second source/drain regions of ones of the memory cells; and
- a plurality of data lines, each data line interconnecting ones of the third source/drain regions of ones of the memory cells.

12. The memory array of claim 11, wherein the substrate includes a bulk semiconductor from which the pillar outwardly extends.

13. The memory array of claim 11, wherein the substrate includes an insulating layer from which the pillar outwardly extends.

* * * * *